United States Patent
Amano et al.

(10) Patent No.: US 7,867,906 B2
(45) Date of Patent: Jan. 11, 2011

(54) SEMICONDUCTOR DEVICE AND METHOD FOR MANUFACTURING SAME

(75) Inventors: Mari Amano, Tokyo (JP); Munehiro Tada, Tokyo (JP); Naoya Furutake, Tokyo (JP); Yoshihiro Hayashi, Tokyo (JP)

(73) Assignee: NEC Corporation, Tokyo (JP)

( * ) Notice: Subject to any disclaimer, the term of this patent is extended or adjusted under 35 U.S.C. 154(b) by 424 days.

(21) Appl. No.: 11/993,285

(22) PCT Filed: May 23, 2006

(86) PCT No.: PCT/JP2006/310253
§ 371 (c)(1),
(2), (4) Date: Apr. 8, 2008

(87) PCT Pub. No.: WO2006/137237
PCT Pub. Date: Dec. 28, 2006

(65) Prior Publication Data
US 2010/0193953 A1    Aug. 5, 2010

(30) Foreign Application Priority Data
Jun. 22, 2005    (JP) ............................. 2005-182645

(51) Int. Cl.
*H01L 21/302* (2006.01)
*H01L 21/461* (2006.01)
(52) U.S. Cl. ...................................... 438/687; 438/672
(58) Field of Classification Search ................ 438/629, 438/672, 637, 653, 687
See application file for complete search history.

(56) References Cited

U.S. PATENT DOCUMENTS

| 7,088,003 | B2 * | 8/2006 | Gates et al. ................. 257/774 |
| 2004/0000719 | A1 | 1/2004 | Matsubara et al. |
| 2004/0087078 | A1 * | 5/2004 | Agarwala et al. ........... 438/200 |
| 2006/0255463 | A1 * | 11/2006 | Won ........................... 257/751 |
| 2009/0305498 | A1 * | 12/2009 | Streck et al. ................ 438/627 |

(Continued)

FOREIGN PATENT DOCUMENTS

JP    09-289214 A    11/1997

(Continued)

OTHER PUBLICATIONS

International Search Report of PCT/JP2006/310253 filed May 23, 2006, date of mailing Aug. 22, 2006.

*Primary Examiner*—S. V Clark
(74) *Attorney, Agent, or Firm*—Young & Thompson

(57) ABSTRACT

A trench is formed in an insulation film formed on top of a semiconductor substrate, and a barrier metal film is formed on the surface of the trench. After a copper or copper alloy film is formed on the barrier metal film, an oxygen absorption film in which a standard energy of formation of an oxidation reaction in a range from room temperature to 400° C. is negative, and in which an absolute value of the standard energy of formation is larger than that of the barrier metal film is formed, and the assembly is heated in a temperature range of 200 to 400° C. A semiconductor device can thereby be provided that has highly reliable wiring, in which the adhesion to the barrier metal film in the copper interface is enhanced, copper diffusion in the interface is suppressed, and electromigration and stress migration are prevented.

5 Claims, 13 Drawing Sheets

U.S. PATENT DOCUMENTS

2010/0181682 A1 * 7/2010 Arai .......................... 257/774

FOREIGN PATENT DOCUMENTS

| JP | 2003-332426 A | 11/2003 |
| JP | 2004-031847 A | 1/2004 |
| WO | 2004/053971 A1 | 6/2004 |
| WO | 2004/061931 A1 | 7/2004 |

* cited by examiner

SEMICONDUCTOR DEVICE AND METHOD FOR MANUFACTURING SAME

TECHNICAL FIELD

The present invention relates to a semiconductor device having wiring, and particularly relates to a semiconductor device composed of a trench wiring (damascene wiring) structure having copper as the primary component, and to a method for manufacturing the semiconductor device.

BACKGROUND ART

Aluminum (Al) or Al alloy has been widely used in the past as the conductive material in silicon semiconductor integrated circuits (LSI). Copper (Cu) has come to be used as the conductive material in order to increase reliability and reduce wiring resistance in the wiring in conjunction with advances in LSI miniaturization.

Since processing by dry etching is difficult, a damascene method is generally used when the copper wiring is formed. The damascene method is a method whereby copper is filled into a wiring trench and/or a via formed in an insulation film on the semiconductor substrate, and wiring is formed by polishing off and removing the excess copper.

The dimensions of wiring have become smaller in recent years in conjunction with LSI miniaturization, and disconnection defects in copper wiring are a serious problem. Copper migration is a contributing factor to wiring disconnection defects. Copper migration can be broadly classified into two types according to drive power. One type is electromigration, which is caused by current flowing in the wiring, and the other type is stress migration, which is caused by stress in the wiring. The current density flowing in the wiring increases as the wiring becomes smaller, and migration of copper easily occurs due to electric wind. A stress gradient occurs at the minute junction of a via and the wiring, and migration of copper occurs in order to alleviate the stress.

Copper migration easily occurs at copper grain boundaries and the interface of different types of material between the copper and the surrounding film. The reason for this is that the activation energy of copper diffusion at these locations is smaller than that of the copper volume diffusion. In order to prevent diffusion of copper, the stability of the copper grain boundaries must be increased, and the adhesion between the copper and the surrounding film must be enhanced.

A method for adding an additive element to the copper wiring to create a copper alloy has been reported as a method for preventing copper migration. In Patent Document 1, an alloy in which silver or the like is added to copper is used as a copper alloy. Methods for forming a copper alloy film in which these elements are added include a sputtering method that uses a target as an alloy to which the additive is added, a method for forming alloys from platings of tin or chromium with copper, and a method for forming an alloy by a CVD method or the like.

There is also a method whereby a film having a function for enhancing adhesion with copper is provided to a barrier metal part. In Patent Document 2, a technique is disclosed for forming a film composed of a material having good adhesion with copper on a barrier metal that is formed by chemical vapor deposition or ALD, whereby electromigration defects and the like are prevented, and the reliability of the wiring is enhanced.

Patent Document 1: Japanese Laid-open Patent Application No. 9-289214
Patent Document 2: Japanese Laid-open Patent Application No. 2003-332426

DISCLOSURE OF THE INVENTION

Problems the Invention is Intended to Solve

Conventional techniques include methods for alloying the wiring itself, as described in Patent Document 1, and methods for enhancing the adhesion between the copper and the surrounding barrier metal film, as described in Patent Document 2. However, the conventional techniques have such problems as the ones described below.

(1) When another metal element is added to copper wiring to create copper alloy wiring, the copper grain boundaries can be stabilized, diffusion of copper in the boundary portions can be suppressed, and the reliability of the wiring can be enhanced. However, when diffusion of copper more easily occurs at the interface of the copper with a different type of material, diffusion of copper occurs with priority at the boundary portions. Therefore, a technique is needed for increasing adhesion of the copper with the surrounding material and preventing copper migration. Particularly since copper or copper alloy adheres poorly to an oxide, interface oxidation in the interface region must be suppressed.

(2) When a barrier metal film having a high degree of adhesion to copper is used, copper diffusion at the interface is suppressed, and reliability can be increased. However, when the wiring is formed by a damascene method, problems occur in that oxygen diffused in the copper film oxidizes the barrier metal film during the heating step from the natural oxide film on the surface of the copper that is filled into the wiring trenches. The diffusion rate of oxygen is high particularly at the copper grain boundaries, and severe oxidation of the barrier metal film is observed in the portions where the barrier metal surface is in contact with the copper grain boundaries. The natural oxidation rate of the copper film surface is high, and even when the surface oxide film is temporarily removed prior to the heating step, it is difficult to prevent oxidation of the barrier metal film, which is generally composed of a material that oxidizes more easily than copper. Since the adhesion between the copper film and the oxidized barrier metal film deteriorates, a technique is needed for preventing oxidation of the barrier metal film due to oxygen diffusion from the natural oxide film of the copper surface during the heating step. Oxygen included as an impurity in the copper film is also moved by the heating step to the interface, which is a more stable potential field, and a technique is therefore needed for reducing the oxygen concentration in the copper film. Oxygen in a copper film or copper alloy film takes electrons from copper atoms (Cu) in the metal state to form oxygen ions ($O^{2-}$), and the copper atoms in the metal state are also changed to ions ($Cu^+$, $Cu^{2+}$). These ions are moved by an electric field, and therefore cause reduced wiring reliability.

An object of the present invention is to provide a semiconductor device having highly reliable wiring in which adhesion with the barrier metal film in the copper interface is enhanced, copper diffusion in the interface is suppressed, and electromigration and stress migration are prevented, and to provide a method for manufacturing the semiconductor device.

Means for Solving the Problems

The semiconductor device manufacturing method of the present invention is characterized in comprising (a) a step for forming a trench and/or a via for forming wiring, in a prescribed region in an insulation film formed on top of a semiconductor substrate, (b) a step for forming a barrier metal film on the insulation film in which the trench and/or via is formed, (c) a step for forming a copper or copper alloy film on the barrier metal film, (d) a step for forming on the copper or copper alloy film an oxygen absorption film in which a standard energy of formation of an oxidation reaction in a range from room temperature to 400° C. is negative, and in which an absolute value of the standard energy of formation is larger than that of the barrier metal film formed in the (b) step, (e) a step for heating a layered film composed of the barrier metal film, the copper or copper alloy film, and the oxygen absorption film in a temperature range of 200 to 400° C., and (f) a step for removing an upper part of the layered film and forming wiring.

The copper or copper alloy film formed in the (c) step may be a copper plating film having a copper alloy film as a seed in which a solid solution is formed with an added element for which the absolute value of the standard energy of formation of the oxidation reaction in the range from room temperature to 400° C. is larger than that of the barrier metal film.

A configuration may be adopted in which the copper or copper alloy film formed in the (c) step is a copper plating film having the copper alloy film as a seed in which a solid solution is formed with an added element; and the absolute value of the standard energy of formation of the oxidation reaction of the added element is larger than that of the barrier metal film, and is equal to or less than that of the metal that constitutes the oxygen absorption film formed in the (d) step.

A thickness of the oxygen absorption film formed in the (d) step may be 100 Å or less.

A configuration may also be adopted in which the barrier metal film is tantalum, tantalum nitride, or a layered film thereof, and the oxygen absorption film is formed by a film having aluminum, titanium, magnesium, calcium, zirconium, beryllium, hafnium, or silicon as a primary component.

The semiconductor device according to the present invention is a semiconductor device having a copper or copper alloy film positioned in at least one layer, and a barrier metal film for covering a periphery of wiring that is formed in a prescribed region in an insulation film formed on top of a semiconductor substrate; wherein the semiconductor device is characterized in that an oxide of the barrier metal film is not present in a region in which the copper or copper alloy film is in contact with the barrier metal film.

Furthermore, a concentration of oxygen included in the copper or copper alloy film is preferably $4\times10^{18}$ atoms/cm$^3$ or less in a wiring internal portion other than an interface region with the barrier metal film. In the case of a copper plating film in which a copper alloy seed film is formed as a seed in which an added element forms a solid solution in the copper alloy film, an oxide of the barrier metal film is not present, and an oxygen concentration peak is present in the plating film interface with the copper alloy seed film in the region in which the barrier metal film is in contact with the copper or copper alloy film. At this time, the concentration of the added element is high in a copper alloy seed film region of the copper or copper alloy film, and the concentration of the added element is low in a copper plating film region.

In the present invention, the term "oxide of the barrier metal" refers to an oxide of the barrier metal that is formed in the interface region of the barrier metal and the copper or copper alloy film. Since the volume of the barrier metal is increased through oxidation, the barrier metal is formed to have a certain thickness with the interface region of the barrier metal and the copper or copper alloy at the center. The presence of an oxide of the barrier metal can be determined by elemental analysis by SIMS (Second Ion Mass Spectroscopy), or TEM (Transmission Electron Microscopy) analysis. In the case of SIMS analysis, the oxygen concentration is analyzed with the interface region of the barrier metal and the copper or copper alloy at the center. When an oxide of the barrier metal is not present, there is no peak or inflection point in the oxygen concentration profile, and the profile decreases or increases monotonically in the interface of the barrier metal with the copper or copper alloy. When an oxide of the barrier metal is present, a peak or an inflection point is present in the oxygen concentration profile in the interface of the barrier metal and the copper or copper alloy, and the profile no longer increases monotonically or decreases monotonically. In a depth-direction analysis by SIMS, since measurement is performed during sputtering, the portion detected as the interface does not have a steep concentration gradient, as in the actual structure, and the interface region and the presence of barrier metal oxidation can therefore be determined by the change in the profile, as described above. A state in which "an oxide of the barrier metal is not present" in the present invention is a state in which a peak or an inflection point is not present in the oxygen concentration profile, and the profile decreases or increases monotonically in the interface of the barrier metal and the copper or copper alloy in the abovementioned determination through SIMS analysis. The "wiring internal portion other than an interface region with the barrier metal" is the portion of the copper or copper alloy film that is 20 nm or farther from the barrier metal/copper (alloy) interface in the copper or copper alloy film that is surrounded by the barrier metal film.

Adhesion of the copper wiring and the barrier metal film can be enhanced, and the reliability of the wiring can be increased through the structure of the present invention described above, i.e., by adopting a structure in which an oxide of the barrier metal film is not present in the portion where the surface of the barrier metal film is in contact with the grain boundaries of the copper or copper alloy film, and by making the average oxygen concentration in the copper or copper alloy wiring $4\times10^{18}$ atoms/cm$^3$ or less. The reliability of the wiring is improved by making the oxygen concentration in the copper wiring film at least $4\times10^{18}$ atoms/cm$^3$ or less, and eliminating peaks in the oxygen concentration in the interface between the barrier metal and the copper.

When a copper film formed on a wiring trench or a via is heated to a high temperature, oxygen (indicated by black circles in the drawing) diffuses into the copper film from the natural oxide film formed on the copper film surface, as shown in FIG. 1, and the barrier metal oxidizes to the interface of the barrier metal and the copper. Therefore, in the present invention, the copper film is heated to a high temperature of 200° C. or higher after an oxygen absorption film, in which the absolute value of the standard energy of formation of the oxidation reaction in the range from room temperature to 400° C. is larger than that of the barrier metal film, is formed on the copper film surface as shown in FIG. 2. The natural oxide film on the surface of the copper film is thereby bonded with the metal that constitutes the aforementioned oxygen absorption film, whereby oxygen diffusion into the copper film is prevented, and oxygen as an impurity included in the copper film is absorbed. A semiconductor device having the aforementioned wiring structure can thereby be obtained. Crystal grains of copper are preferably grown, and impurities and voids in the film are preferably reduced in advance by heating at a low temperature of 200° C. or less prior to forming the oxygen absorption film on the copper film surface.

The aforementioned copper film is a copper plating film having a copper alloy film as a seed in which a solid solution is formed with an added element for which the absolute value of the standard energy of formation of the oxidation reaction in the range from room temperature to 400° C. is larger than that of the barrier metal film. The oxygen in the vicinity of the interface of the barrier metal and the copper can thereby be trapped on the surface of the copper alloy film used as the seed, and the reliability of the interface can therefore be further increased. However, the absolute value of the standard energy of formation of the oxidation reaction of the metal element that forms a solid solution with the copper in this case must be equal to or less than that of the oxygen absorption film formed on the copper film. The reason for this is that absorption of oxygen must be performed primarily by the oxygen absorption film formed on the surface of the copper plating film. Since the oxygen absorption film portion is removed in a subsequent CMP step, a copper film of even higher purity can be obtained by this method. When the same element as the metal of the oxygen absorption film forms a solid solution in the seed, the concentration of the added element in the seed is low, being from several parts per million to several atomic percent, most of the oxygen can therefore be absorbed by the oxygen absorption film formed on the upper surface, and a high-purity copper film can also be obtained.

The thickness of the oxygen absorption film formed on the copper film surface is adequate as long as it is a thickness necessary for absorbing oxygen on the copper film surface through a mechanism in which the metal atoms that constitute the oxygen absorption film chemically react with and fix the surface oxygen. The film thickness is set to 100 Å or less to obtain an extremely thin film so that most of the film participates in bonding with oxygen. Specifically, diffusion of the metal element that constitutes the oxygen absorption film into the copper film is preferably prevented as much as possible. This is so that the resistance of the copper wiring is not increased by diffusion of the metal element that constitutes the oxygen absorption film, and that voids do not occur in the copper film, particularly in the minute vias, due to the Kirkendall effect. It has been confirmed that the oxygen concentration in the copper alloy film increases due to bonding of oxygen with the added element in the copper alloy film when the concentration of the added element in the copper film is high. The concentration of the added element is therefore preferably $10^{19}$ atoms/cm$^3$ or less.

EFFECTS OF THE INVENTION

Adhesion of the copper wiring and the barrier metal film can be enhanced, and electromigration resistance and stress migration resistance can be enhanced through the use of the semiconductor device and the method for manufacturing the semiconductor device according to the present invention.

Figure 1:
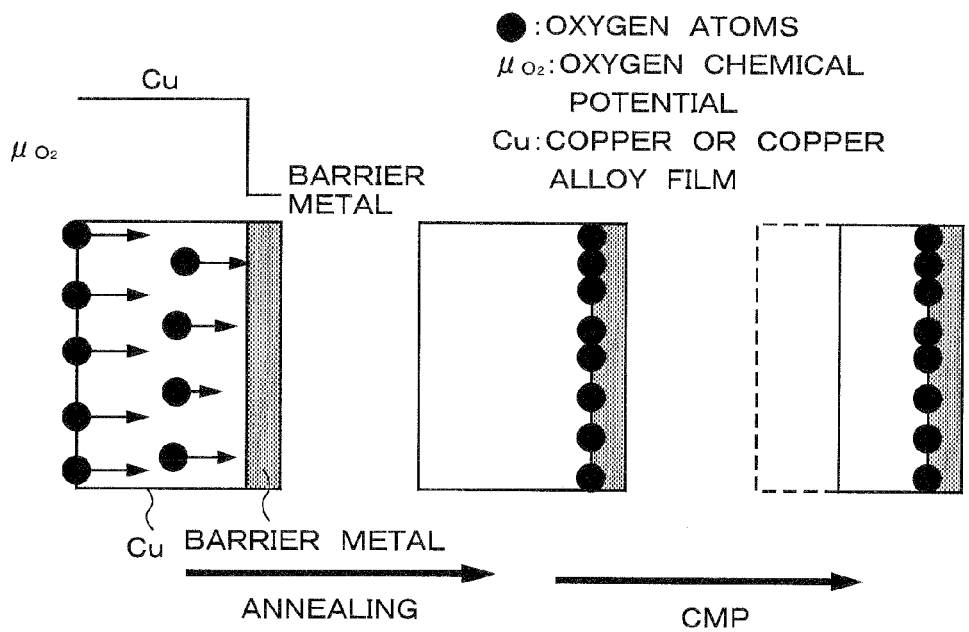
FIG. 1 is a schematic view showing the behavior of oxygen in the copper film in the conventional technique.
Figure 2:
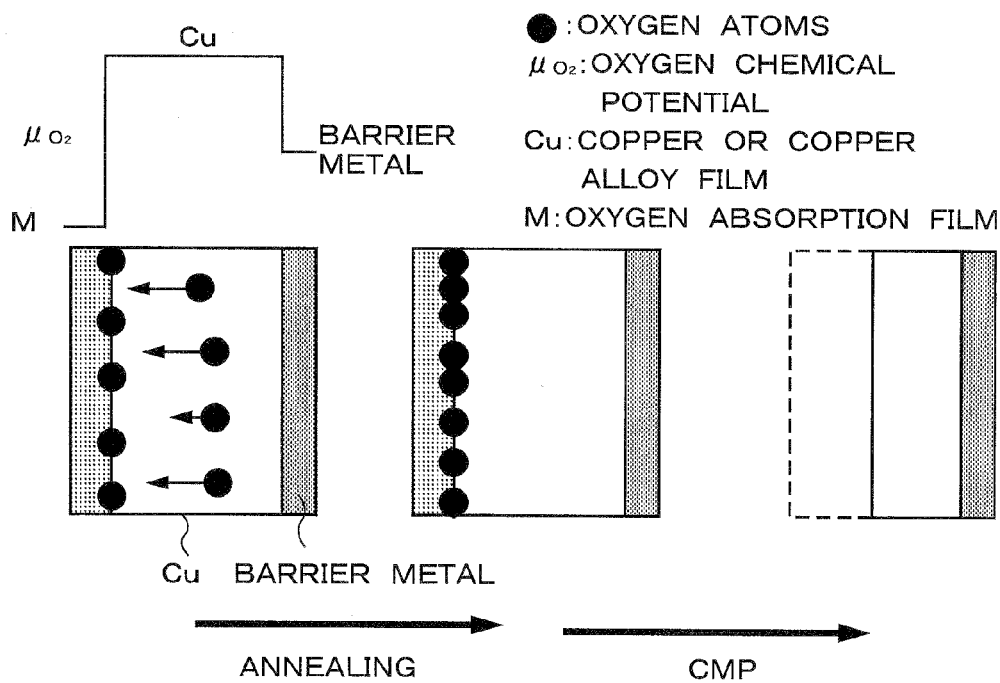
FIG. 2 is a schematic view showing the behavior of oxygen in the copper film according to the present invention.

KEY 1 semiconductor substrate
2 interlayer insulation film
3a, 3b etch-stop film
4a, 4b, 4c barrier metal film
5a, 5b copper or copper alloy wiring
5c copper or copper alloy via
6a, 6b wiring protective film
7 via interlayer insulation film
9 via-layer hard mask
10a, 10b wiring interlayer insulation film
11a, 11b wiring trench
11c via hole
12 copper or copper alloy seed film
13 copper plating film
14 oxygen absorption film
15a, 15b, 15c low-oxygen-concentration copper film
16a, 16b, 16c side wall protection film
17a, 17b wiring-layer hard mask

BEST MODE FOR CARRYING OUT THE INVENTION

Before the invention of the present application is described in detail, the terminology used in the present application will be described. In the present embodiments, the term "alloy"

refers to a substance in which a metal element other than the primary component is added to the primary component. For example, in the case of "copper alloy," the primary component is copper, and a metal element other than copper is added to create an alloy. In the case of "copper-aluminum alloy," the primary component is copper, and aluminum is added to the copper to create an alloy. Furthermore, such an alloy has another metal element intentionally added to the primary component, and the term does not exclude the inclusion of unavoidable impurities that are included as a result of the process. Accordingly, unavoidable impurities may also be included in the copper.

The term "barrier metal film" refers to a conductive film having barrier properties that covers the side and bottom surfaces of the wiring in order to prevent the metal elements that constitute the wiring from diffusing into the interlayer and/or underlayer insulation film. For example, when the wiring is composed of metal elements primarily composed of copper, high-melting metals such as tantalum (Ta), tantalum nitride (TaN), titanium nitride (TiN), and tungsten carbonitride (WCN); nitrides and the like thereof, or layered films thereof are used.

The term "semiconductor substrate" refers to the substrate on which the semiconductor device is composed, and particularly includes not only substrates created on a monocrystalline silicon substrate, but also SOI (Silicon on Insulator) substrates, TFT (Thin Film Transistor) substrates for manufacturing liquid crystals, and other substrates.

The term "interlayer insulation film" refers to a film for insulating and separating the wiring materials, and may be a film or the like that includes voids within the film to reduce capacitance between the wiring units. Typical examples thereof may include $SiO_2$ and HSQ (hydrogen silsesquioxane) film (e.g., Type 12™), MSQ (methyl silsesquioxane) film (e.g., JSR-LKD™, ALCAP™, NCS™, IPS™, and HOSP™), organic polymer film (SiLK™, Flare™), SiOCH, SiOC (e.g., Black Diamond™, CORAL™, AuroraULK™, Orion™, and the like); or insulation thin films in which an organic compound is included in the abovementioned substances; or molecular pore film in which a cyclic organic silica starting material is used.

The "sputtering method" may be a commonly used sputtering method, but long-slow sputtering, collimation sputtering, ionized sputtering, and other highly directional sputtering methods may also be used for enhancing the fill characteristics, enhancing film quality, and obtaining uniform film thickness in the wafer plane. When an alloy is sputtered, the formed metal film can be made into an alloy film by including an amount of the metal other than the primary component equal to or less than the solid solution limit in the metal target in advance.

The "CMP (Chemical Mechanical Polishing) method" is a method for planarizing irregularities that occur on the wafer surface during the multilayer wiring formation process by bringing the wafer surface into contact with a rotating polishing pad and polishing while running a polishing fluid over the wafer surface. In wiring formation by the damascene method, the CMP method is used particularly to remove excess metal portions and obtain a flat wiring surface after metal is filled into the wiring trenches or the via holes.

The term "hard mask" refers to an insulation film that is used as a mask during wiring pattern formation. However, in the present invention, the hard mask refers to an insulation film that is layered on the interlayer insulation film to provide protection when direct CMP is difficult to perform due to a reduction in strength caused by a reduction in the conductivity of the interlayer insulation film.

Embodiment 1

The wiring structure according to Embodiment 1 of the present invention will be described using FIG. 3. Embodiment 1 of the present invention is an embodiment in which the present invention is applied to dual damascene wiring.

Figure 3:
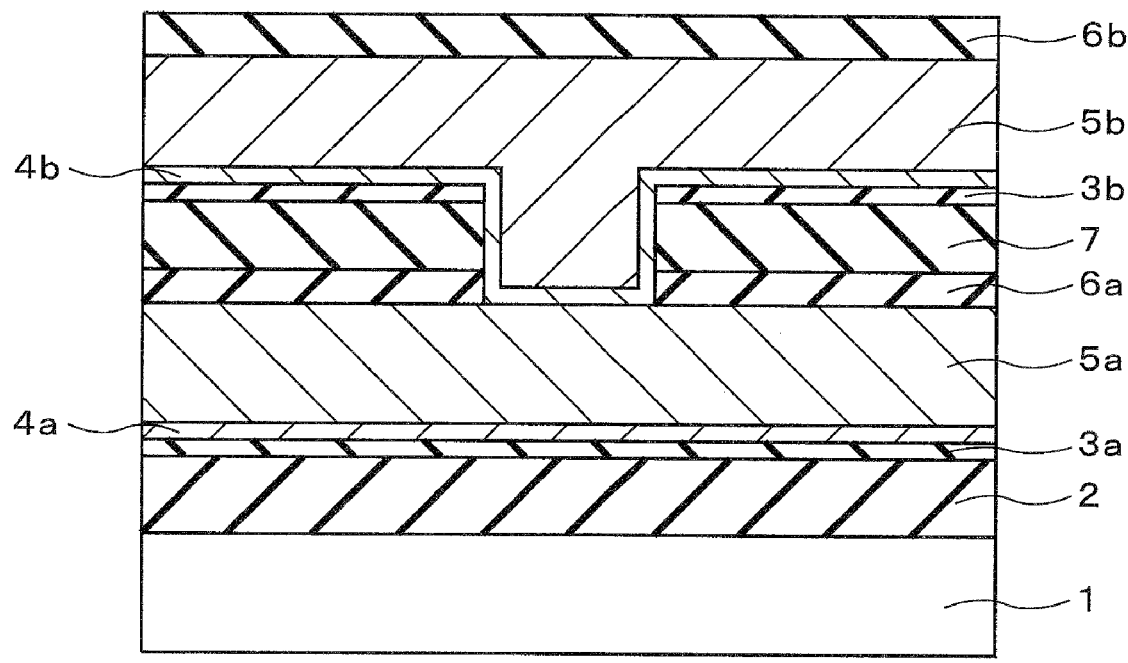
FIG. 3 is a diagram showing an overview of the cross-sectional structure of a portion of the wiring structure in Embodiment 1 of the present invention.

As shown in FIG. 3, in the wiring structure according to Embodiment 1 of the present invention, a wiring structure is formed in which an interlayer insulation film 2 and an etch-stop film 3a are layered on a semiconductor substrate 1 on which a semiconductor element (not shown) is formed, copper or copper alloy wiring 5a surrounded by a barrier metal film 4a is formed by a damascene method on the upper part of the etch-stop film 3a, and the upper surface of the wiring is covered by a wiring protective film 6a. A via interlayer insulation film 7 and an etch-stop film 3b are layered on the upper layer, and a via and wiring are formed by a dual damascene method. A wiring structure is formed in which the via and wiring are composed of copper or copper alloy wiring 5b surrounded by a barrier metal film 4b, and the surface of the wiring is covered by a wiring protective film 6b. An oxide of the barrier metal films 4a, 4b is not present in the copper or copper alloy wiring 5a, 5b and the surface contacting portions of the barrier metal films 4a, 4b. Furthermore, the concentration of oxygen included in the copper or copper alloy wiring 5a, 5b is $4 \times 10^{18}$ atoms/cm$^3$ or less in the wiring-internal portion that does not include the region of the interface with the barrier metal.

When copper alloy wiring is formed by a copper plating film in which a copper alloy seed film is formed as a seed in which an added element forms a solid solution, in addition to the abovementioned characteristics, a peak in the oxygen concentration is present at the interface of the copper alloy seed film and the plating film. Furthermore, with the interface as the boundary, the concentration of the added element is high in the copper alloy seed film region of the copper alloy film, and the concentration of the added element is low in the copper plating film region.

When the abovementioned wiring structure is used, the adhesion between the copper or copper alloy wiring 5a, 5b and the barrier metal films 4a, 4b can be enhanced, and electromigration resistance and stress migration resistance can be enhanced. Specifically, since an oxide of the barrier metal films 4a, 4b is not present in the copper or copper alloy wiring 5a, 5b and the surface contacting portions of the barrier metal films 4a, 4b, adhesion between the copper alloy wiring 5a, 5b and the barrier metal films 4a, 4b can be enhanced, the activation energy of diffusion of the metal in the copper or copper alloy wiring in the interface, which causes stress migration and electromigration, can be enhanced, and a significant enhancement of wiring reliability is obtained. Since the interface of the copper with another material becomes a pathway for void diffusion in the copper, in which the stress that causes stress migration is a driving force, enhanced adhesion is linked to enhanced resistance to stress migration. Ionization of copper atoms is suppressed by reducing the oxygen concentration in the copper or copper alloy wiring 5a, 5b. Mass transfer due to ion field drift or the like is thereby suppressed, and electromigration resistance is enhanced. When a copper alloy film is obtained by copper plating using a copper alloy film as a seed in which a solid solution is formed with an added element for which the absolute value of the standard energy of formation of the oxidation reaction in a range from room temperature to 400° C. is larger than that of the barrier metal film, since oxygen is trapped on the surface of the copper alloy seed, further effects are obtained whereby oxidation is suppressed in the barrier metal interface with the copper. A peak is therefore present in the oxygen concentration in the interface of the copper alloy seed film and the plating film. Furthermore, with the interface as the boundary, the concentration of the added element is high in the copper alloy seed film region of the copper alloy film, and the concentration of the added element is low in the copper plating film region. However, the metal added element in the film when a copper alloy film is used contributes significantly to the wiring resistance, the metal added element diffused into the plating film also bonds with oxygen atoms in the film, and reduction of the oxygen concentration in the plating film is suppressed even when heat treatment is applied (see Example 2). For these reasons, the concentration of the metal added element is preferably not increased further than necessary.

The present structure can also easily be confirmed from the manufactured product. The structure can be confirmed by measuring the impurity concentration in the metal wiring when at least a portion of the structure has multilayer wiring in semiconductor products having memory circuits such as DRAM (Dynamic Random Access Memory), SRAM (Static Random Access Memory), flash memory, FRAM (Ferro Electric Random Access Memory), MRAM (Magnetic Random Access Memory), resistance random access memory, and the like; microprocessors and other semiconductor products having logical circuits; mixed semiconductor products that employ the abovementioned types of circuits simultaneously; or SIP (Silicon In Package) and the like in which a plurality of the abovementioned semiconductor devices is layered. Specifically, a determination can be made by measuring the oxygen concentration by selecting a prescribed location and performing SIMS (Second Ion Mass Spectroscopy). When an oxide of the barrier metal is not present, a peak or inflection point is not present in the oxygen concentration profile in the interface of the barrier metal and the copper or copper alloy, and the profile decreases or increases monotonically. However, when an oxide of the barrier metal is present, a peak or inflection point is present in the oxygen concentration profile in the interface of the barrier metal and the copper or copper alloy, and the profile no longer increases monotonically or decreases monotonically. In a depth-direction analysis by SIMS analysis, since measurement is performed during sputtering, the portion detected as the interface does not have a steep concentration gradient, as in the actual structure, and the interface region and the presence of barrier metal oxidation must therefore be determined by the change in the profile, as described above. Alternatively, the presence of oxidation of the barrier metal film in the portion where the barrier metal film is in contact with the grain boundaries in the copper or copper alloy wiring can be observed using the contrast of a TEM image in which the semiconductor product is cut in the cross-sectional direction. The reason for this is that when oxygen diffuses into the film from the surface of the copper or copper alloy, the oxygen diffusion coefficient is larger in the grain boundaries than within the grains. Therefore, since oxidation of the barrier metal progresses faster in the portions of contact between the copper grain boundaries and the barrier metal, the oxidation can easily be observed in a TEM observation image or the like.

The method for manufacturing a semiconductor device according to Embodiment 1 will next be described with reference to the wiring sectional view shown in FIG. 4.

Figure 4A:
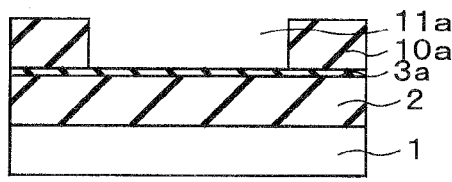
FIG. 4 is a sectional view showing the manufacturing method according to Embodiment 1 of the present invention.

First, as shown in FIG. 4A, the interlayer insulation film 2 composed of $SiO_2$, the etch-stop film 3a composed of SiCN, and a wiring interlayer insulation film 10a composed of $SiO_2$ are layered on the semiconductor substrate 1 in which a semiconductor element (not shown) is formed, and a wiring trench 11a is formed in the wiring interlayer insulation film 10a by a damascene method.

Examples of films that may be used as the etch-stop film 3a are an $SiO_2$ film, an SiN film, an SiC film, an SiCN film, an SiOC film, an SiOCH film, or at least one of a film in which an organic compound is included in the aforementioned films, a film having an organic compound as the primary component, and a film in which SiO is included in a film having an organic compound as the primary component. These films are films provided to enhance the workability of the via hole and the dual-damascene shaped wiring trench, and may be modified according to the intended working material. The use of $SiO_2$ or DVS-BCB (divinylsiloxane-benzocyclobutene) created by plasma polymerization is particularly preferred. Alternatively, the etch-stop film 3a may be omitted when not useful for etching.

Typical examples of the wiring interlayer insulation film 10a may include $SiO_2$, SiC, SiCN, HSQ (hydrogen silsesquioxane) film (e.g., Type 12™), MSQ (methyl silsesquioxane) film (e.g., JSR-LKD™, ALCAP™, NCS™, IPS™, and HOSP™), organic polymer film (SiLK™, Flare™), SiOCH, SiOC (e.g., Black Diamond™, CORAL™, AuroraULK™, Orion™, and the like); or insulation thin films in which an organic compound is included in the abovementioned substances; molecular pore film in which a cyclic organic silica starting material is used; film in which a plurality of any of the abovementioned films is layered; film in which the composition or density of any of the abovementioned films is varied in the film thickness direction; or film in which the via interlayer insulation film of the abovementioned films is irradiated by UV and increased in strength.

An example of the layering structure is a structure in which a two-layer structure composed of $SiO_2$/AuroraULK™ (=upper layer/lower layer) is formed, and the $SiO_2$ is used as a protective film for AuroraULK™ during CuCMP, or a structure in which Black Diamond™/AuroraULK™ (=upper layer/lower layer) is used to reduce capacitance between wiring units.

An example of the layering structure is a structure in which a three-layer structure composed of $SiO_2$/AuroraULK™/$SiO_2$/(=upper layer/middle layer/lower layer) is formed, wherein the upper-layer $SiO_2$ is used as a protective film for the AuroraULK™ during CuCMP, and the lower-layer $SiO_2$ is used as an adhesive layer.

Figure 4B:
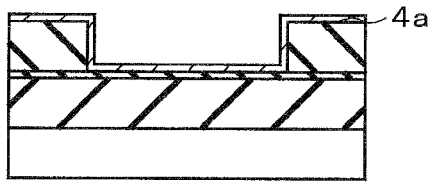

The barrier metal film 4a is then formed on a wiring trench 11a as shown in FIG. 4B. The barrier metal film 4a may be formed using a sputtering method, a CVD method, an ALCVD method, or the like. For example, high-melting metals such as tantalum (Ta), tantalum nitride (TaN), titanium nitride (TiN), and tungsten carbonitride (WCN); nitrides and the like thereof, or layered films thereof are used. A Ta/TaN (=upper layer/lower layer) layered film is particularly preferred for use.

Figure 4C:
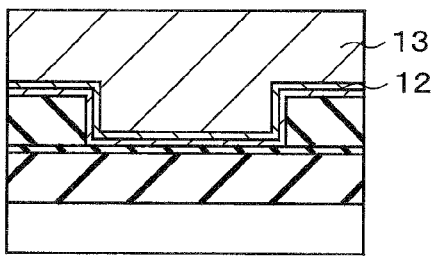
Figure 4D:
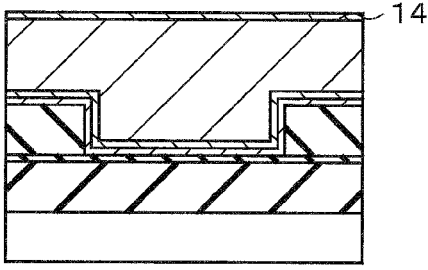
Figure 4E:
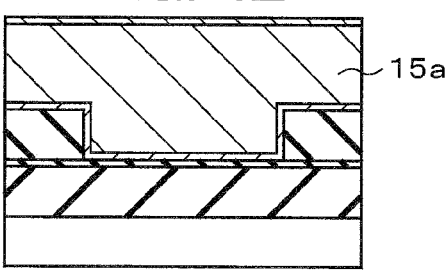

Next, a copper or copper alloy seed film 12 is formed on the barrier metal film 4a as shown in FIG. 4C, and a copper plating film 13 is then filled into the wiring trench 11a by an electroplating method using the copper or copper alloy seed film 12 as the electrode. An oxygen absorption film 14 is then formed on the copper plating film 13 as shown in FIG. 4D. Heat treatment at a temperature in the range of 200 to 400° C. is then applied to the structure shown in FIG. 4D (the barrier metal film 4a, the films 12, 13 primarily composed of copper, and the oxygen absorption film 14), whereby the oxygen absorption film 14 reacts with the oxygen within and on the surface of the copper plating film 13, and a low-oxygen-concentration copper film 15a is formed on the barrier metal film 4a as shown in FIG. 4E.

The copper or copper alloy seed film 12 may be formed by a CVD method or a sputtering method in which a copper or copper alloy target is used. The metal element included in the copper alloy target may be at least one metal selected from aluminum, tin, titanium, tungsten, silver, zirconium, indium, and magnesium. In particular, copper aluminum alloy seed layers may be formed by an ionized sputtering method in which a copper aluminum alloy target is used that includes 0.1 to 4.0 at % of aluminum in a copper target, and copper may be filled in by an electroplating method using the copper aluminum alloy seed layers as electrodes to fabricate the copper or copper alloy seed film 12. In other words, a copper plating film 13 having a copper alloy film 12 as a seed in which a solid solution is formed with an added element for which the absolute value of the standard energy of formation of the oxidation reaction in the range from room temperature to 400° C. is larger than that of the barrier metal film 4a is preferably used as the film 15a primarily composed of copper that is the copper or copper alloy film. In the copper plating film 15a having the copper alloy film 12 as a seed in which the added element forms a solid solution, the absolute value of the standard energy of formation of the oxidation reaction of the added element is preferably larger than that of the barrier metal film 4a and less than or equal to that of the metal that constitutes the oxygen absorption film 14 formed in the aforementioned step. When an alloy seed layer and an electroplating method are combined, the concentration of metal elements other than copper in the alloy wiring is less than or equal to the concentration thereof in the alloy target.

There is also a method for filling in the wiring trench by sputtering or CVD rather than the method for performing electroplating on the copper or copper alloy seed film.

The material used for the oxygen absorption film 14 is a material in which a standard energy of formation of the oxidation reaction in the range from room temperature to 400° C. is negative, and in which the absolute value of the standard energy of formation is larger than that of the barrier metal film 4a formed in the step shown in FIG. 4C.

When an oxygen absorption film in which the standard energy of formation of the oxidation reaction is smaller than that of the barrier metal film is formed on the copper or copper alloy film surface, oxygen in the natural oxide film formed on the copper or copper alloy film surface reacts during the subsequent heating step with the metal that constitutes the oxygen absorption film formed on the surface, and surface oxidation of the barrier metal film due to diffusion of oxygen into the film therefore does not occur. During the heating step, since oxygen components included as impurities in the copper or copper alloy film also react with the metal that constitutes the oxygen absorption film, the oxygen concentration in the copper or copper alloy film can be significantly reduced. A state in which oxides of the barrier metal films 4a, 4b are not present is thereby achieved at the grain boundaries included in the copper or copper alloy wiring 5a as well as in the portions where the surfaces of the barrier metal films 4a, 4b are in contact. The oxygen absorption film that has reacted with the oxygen components is removed in a subsequent CMP step.

When Ta or a structure in which Ta and a nitride film thereof are layered is used as the barrier metal, aluminum, titanium, magnesium, calcium, zirconium, beryllium, hafnium, a silicon film, or the like may be used as the oxygen absorption film. When Ti or a structure in which Ti and a nitride film thereof are layered is used as the barrier metal, aluminum, magnesium, calcium, zirconium, beryllium, a hafnium film, or the like may be used as the oxygen absorption film. The same barrier metal oxidation prevention effects can be obtained by an oxygen absorption film composed of a metal in which the standard energy of formation of the oxidation reaction is negative, and in which the absolute value of the standard energy of formation is larger than that of the barrier metal film, regardless of whether the constituent metal thereof is in a solid solution with respect to the copper or copper alloy film.

Figure 4F:
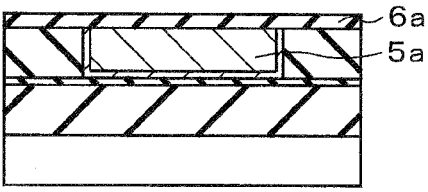
Figure 4G:
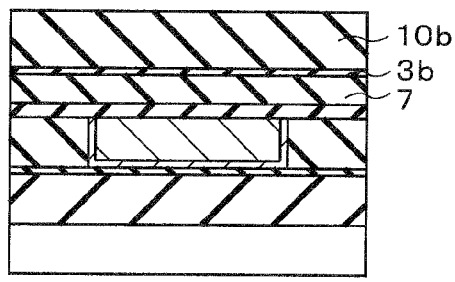

Prescribed quantities of the oxygen absorption film 14 and the low-oxygen-concentration copper film 15a are then removed by CMP (Chemical Mechanical Polishing), the copper or copper alloy wiring 5a is formed, and the upper surface thereof is covered by the wiring protective film 6a, as shown in FIG. 4F. The via interlayer insulation film 7, the etch-stop film 3b, and a wiring interlayer insulation film 10b composed of $SiO_2$ are then formed in sequence on the upper surface of the wiring protective film 6a, as shown in FIG. 4G.

Examples of films that may be used as the wiring protective film 6a for covering the upper surface of the copper or copper alloy wiring 5a are an SiN film, an SiC film, an SiCN film, an SiOC film, an SiOCH film, or at least one of a film in which an organic compound is included in the aforementioned films, a film having an organic compound as the primary component, and a film in which SiO is included in a film having an organic compound as the primary component. For example, a DVS-BCB (divinylsiloxane-benzocyclobutene) film created by a plasma polymerization method, or a DVS-BCB compound or the like may be used. A BCB compound is a compound formed by mixing BCB with a plurality of gas starting materials to form a film. The specific inductive capacity between the wiring units can be reduced through the use of these BCB films.

Typical examples of the via interlayer insulation film 7 may include $SiO_2$, SiC, SiCN, HSQ (hydrogen silsesquioxane) film (e.g., Type 12™), MSQ (methyl silsesquioxane) film (e.g., JSR-LKD™, ALCAP™, NCS™, IPS™, and HOSP™), organic polymer film (SiLK™, Flare™), SiOCH, SiOC (e.g., Black Diamond™, CORAL™, AuroraULK™, Orion™, and the like); or insulation thin films in which an organic compound is included in the abovementioned substances; molecular pore film in which a cyclic organic silica starting material is used; film in which a plurality of any of the abovementioned films is layered; film in which the composition or density of any of the abovementioned films is varied in the film thickness direction; or film in which the via interlayer insulation film of the abovementioned films is irradiated by UV and increased in strength.

Examples of films that may be used as the etch-stop film 3b are an $SiO_2$ film, an SiN film, an SiC film, an SiCN film, an SiOC film, an SiOCH film, or at least one of a film in which an organic compound is included in the aforementioned films, a film having an organic compound as the primary component, and a film in which SiO is included in a film having an organic compound as the primary component. These films are films provided to enhance the workability of the via hole and the dual-damascene shaped wiring trench, and may be modified according to the intended working material. The use of $SiO_2$ or DVS-BCB (divinylsiloxane-benzocyclobutene) created by plasma polymerization is particularly preferred. Alternatively, the etch-stop film 3b may be omitted when not useful for etching.

Typical examples of the wiring interlayer insulation film 10b may include $SiO_2$, SIC, SiCN, HSQ (hydrogen silsesquioxane) film (e.g., Type 12™), MSQ (methyl silsesquioxane) film (e.g., JSR-LKD™, ALCAP™, NCS™, IPS™, and HOSP™), organic polymer film (SiLK™, Flare™), SiOCH, SiOC (e.g., Black Diamond™, CORAL™, AuroraULK™, Orion™, and the like); or insulation thin films in which an organic compound is included in the abovementioned substances; molecular pore film in which a cyclic organic silica starting material is used; film in which a plurality of any of the abovementioned films is layered; film in which the composition or density of any of the abovementioned films is varied in the film thickness direction; or film in which the via interlayer insulation film of the abovementioned films is irradiated by UV and increased in strength.

An example of the layering structure is a structure in which a two-layer structure composed of $SiO_2$/AuroraULK™ (=upper layer/lower layer) is formed, and the $SiO_2$ is used as a protective film for AuroraULK™ during CuCMP, or a structure in which Black Diamond™/AuroraULK™ (=upper layer/lower layer) is used to reduce capacitance between wiring units.

An example of the layering structure is a structure in which a three-layer structure composed of $SiO_2$/AuroraULK™/$SiO_2$/(=upper layer/middle layer/lower layer) is formed, wherein the upper-layer $SiO_2$ is used as a protective film for the AuroraULK™ during CuCMP, and the lower-layer $SiO_2$ is used as an adhesive layer.

Figure 4H:
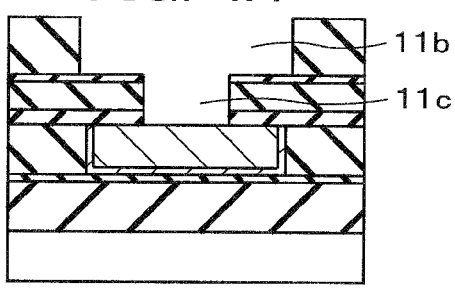
Figure 4I:
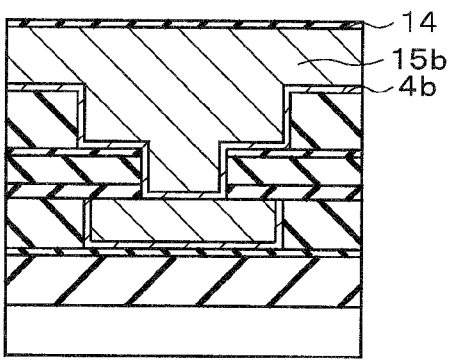

A via hole 11c and a wiring trench 11b are then formed by a dual damascene method as shown in FIG. 4H. The barrier metal film 4b is then formed on the via hole 11c and the wiring trench 11b, and a low-oxygen-concentration copper film 15b is formed on the barrier metal film 4b, as shown in FIG. 4I. The oxygen absorption film 14 used to form the low-oxygen-concentration copper film 15b is then layered on the low-oxygen-concentration copper film 15b. The same method and material as those of the underlayer wiring (15a, 14) are used in the formation described above.

Prescribed quantities of the oxygen absorption film 14 and the low-oxygen-concentration copper film 15b are then removed by CMP, and after the copper or copper alloy wiring 5b is formed, the upper surface is covered by the wiring protective film 6b.

Examples of films that may be used as the wiring protective film 6b for covering the upper surface of the copper or copper alloy wiring 5b are an SiN film, an SiC film, an SiCN film, an SiOC film, an SiOCH film, or at least one of a film in which an organic compound is included in the aforementioned films, a film having an organic compound as the primary component, and a film in which SiO is included in a film having an organic compound as the primary component. For example, a DVS-BCB (divinylsiloxane-benzocyclobutene) film created by a plasma polymerization method, or a DVS-BCB compound or the like may be used. A BCB compound is a compound formed by mixing BCB with a plurality of gas starting materials to form a film. The specific inductive capacity between the wiring units can be reduced through the use of these BCB films.

Use of the wiring structure described above makes it possible to prevent oxidation of the barrier metal in the portions in which the barrier metal films 4a, 4b are in contact with the grain boundaries in the copper or copper alloy wiring 5a, 5b. Since adhesion between the copper or copper alloy wiring 5a, 5b and the barrier metal films 4a, 4b is thereby enhanced, electromigration resistance and stress migration resistance can be enhanced.

The present invention is not limited to a damascene wiring trench processing method.

Embodiment 2

The wiring structure according to Embodiment 2 of the present invention will be described with reference to FIG. 5. Embodiment 2 of the present invention is an embodiment in which the present invention is applied to single damascene wiring.

Figure 5:
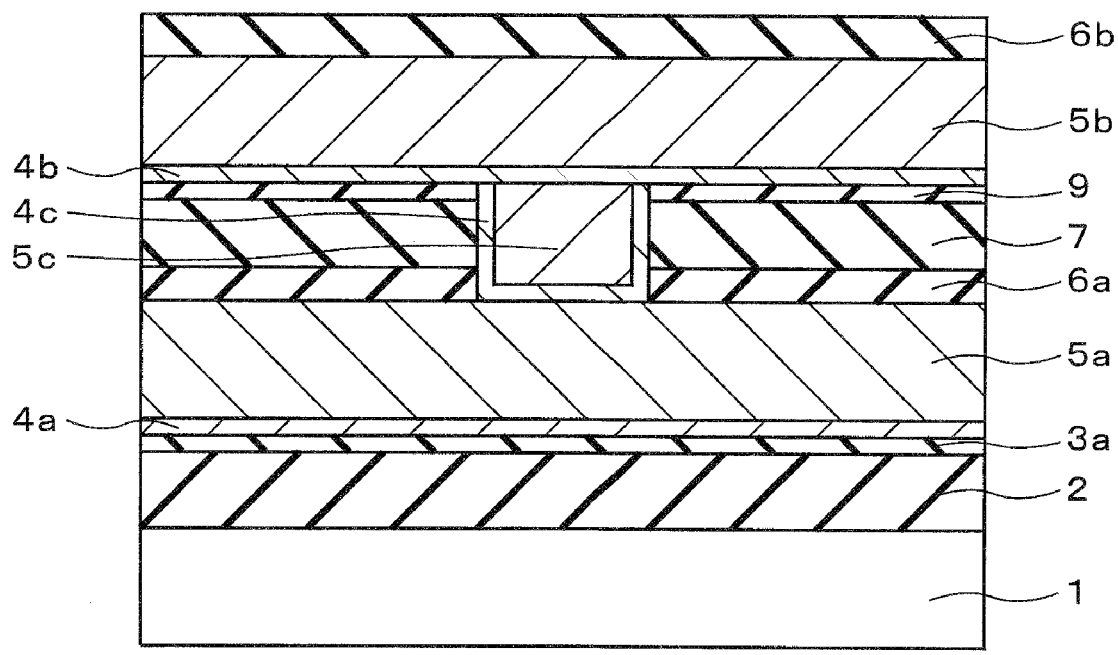
FIG. 5 is a diagram showing an overview of the cross-sectional structure of a portion of the wiring structure in Embodiment 2 of the present invention.

As shown in FIG. 5, in the wiring structure according to Embodiment 2 of the present invention, a wiring structure is formed in which the interlayer insulation film 2 and the etch-stop film 3a are layered on the semiconductor substrate 1 in which a semiconductor element (not shown) is formed, copper or copper alloy wiring 5a surrounded by the barrier metal film 4a is formed by a single damascene method in the upper part, and the upper surface of the wiring is covered by the wiring protective film 6a. On the upper layer thereof, the via interlayer insulation film 7 and a via-layer hard mask 9 are layered, and a via is formed in the inside by the single damascene method. The via is formed by a copper or copper alloy via 5c that is surrounded by a barrier metal film 4c. On the upper layer, wiring formed by the single damascene method is provided, and the wiring is formed by copper or copper alloy wiring 5b surrounded by the barrier metal film 4b. The surface of the copper or copper alloy wiring 5b is covered by the wiring protective film 6b. An oxide of the barrier metal films 4a, 4b, 4c is not present in the grain boundaries included in the copper or copper alloy wiring 5a, 5b and the copper or copper alloy via 5c, and in the portion in contact with the surface of the barrier metal films 4a, 4b, 4c. Furthermore, the oxygen concentration included in the copper or copper alloy wiring 5a, 5b and the copper or copper alloy via 5c is $4 \times 10^{18}$ atoms/$cm^3$ or less in the wiring internal part that does not include the interface region with the barrier metal.

When the copper alloy wiring is formed by a copper plating film in which a copper alloy seed film is formed as a seed in which an added element forms a solid solution, in addition to the abovementioned characteristics, a peak in the oxygen concentration is present at the interface of the copper alloy seed film and the plating film. Furthermore, with the interface as the boundary, the concentration of the added element is high in the copper alloy seed film region of the copper alloy film, and the concentration of the added element is low in the copper plating film region.

When the abovementioned wiring structure is used, the adhesion between the barrier metal films 4a, 4b, 4c and the copper or copper alloy wiring 5a, 5b and copper or copper alloy via 5c can be enhanced, and electromigration resistance and stress migration resistance can be enhanced. Specifically, since an oxide of the barrier metal films 4a, 4b is not present in the copper or copper alloy wiring 5a, 5b and copper or copper alloy via 5c and the surface contacting portions of the barrier metal films 4a, 4b, 4c, adhesion between the barrier metal films 4a, 4b, 4c and the copper or copper alloy wiring 5a, 5b and copper or copper alloy via 5c can be enhanced, the activation energy of diffusion of the metal in the copper or copper alloy wiring in the interface, which causes stress migration and electromigration, can be enhanced, and a significant enhancement of wiring reliability is obtained. Since the interface of the copper with another material becomes a pathway for void diffusion in the copper, in which the stress that causes stress migration is a driving force, enhanced adhesion is linked to enhanced resistance to stress migration. Ionization of copper atoms is suppressed by reducing the oxygen concentration in the copper or copper alloy wiring 5a, 5b and the copper or copper alloy via 5c. Mass transfer due to ion field drift or the like is thereby suppressed, and electromigration resistance is enhanced. When a copper alloy film is obtained by copper plating using a copper alloy film as a seed in which a solid solution is formed with an added element for which the absolute value of the standard energy of formation of the oxidation reaction in a range from room temperature to 400° C. is larger than that of the barrier metal film, since oxygen is trapped on the surface of the copper alloy seed, further effects are obtained whereby oxidation is suppressed in the barrier metal interface with the copper. A peak is therefore present in the oxygen concentration in the interface of the copper alloy seed film and the plating film. Furthermore, with the interface as the boundary, the concentration of the added element is high in the copper alloy seed film region of the copper alloy film, and the concentration of the added element is low in the copper plating film region. However, the metal added element in the film when a copper alloy film is used contributes significantly to the wiring resistance, the metal added element diffused into the plating film also bonds with oxygen atoms in the film, and reduction of the oxygen concentration in the plating film is suppressed even when heat treatment is applied (see Example 2). For these reasons, the concentration of the metal added element is preferably not increased further than necessary.

The present structure can also easily be confirmed from the manufactured product. The structure can be confirmed by measuring the impurity concentration in the metal wiring when at least a portion of the structure has multilayer wiring in DRAM (Dynamic Random Access Memory), SRAM (Static Random Access Memory), flash memory, FRAM (Ferro Electric Random Access Memory), MRAM (Magnetic Random Access Memory), or semiconductor products having memory circuits such as resistance random access memory and the like; microprocessors and other semiconductor products having logical circuits; mixed semiconductor products that employ the abovementioned types of circuits simultaneously; or SIP (Silicon In Package) and the like in which a plurality of the abovementioned semiconductor devices is layered. Specifically, a determination can be made by measuring the oxygen concentration by selecting a prescribed location and performing SIMS (Second Ion Mass Spectroscopy). When an oxide of the barrier metal is not present, a peak or inflection point is not present in the oxygen concentration profile in the interface of the barrier metal and the copper or copper alloy, and the profile decreases or increases monotonically. However, when an oxide of the barrier metal is present, a peak or inflection point is present in the oxygen concentration profile in the interface of the barrier metal and the copper or copper alloy, and the profile no longer increases monotonically or decreases monotonically. In a depth-direction analysis by SIMS analysis, since measurement is performed during sputtering, the portion detected as the interface does not have a steep concentration gradient, as in the actual structure, and the interface region and the presence of barrier metal oxidation must therefore be determined by the change in the profile, as described above. Alternatively, the presence of oxidation of the barrier metal film in the portion where the barrier metal film is in contact with the grain boundaries in the copper or copper alloy wiring can be observed using the contrast of a TEM image in which the semiconductor product is cut in the cross-sectional direction. The reason for this is that when oxygen diffuses into the film from the surface of the copper or copper alloy, the oxygen diffusion coefficient is larger in the grain boundaries than within the grains. Therefore, since oxidation of the barrier metal progresses faster in the portions of contact between the copper grain boundaries and the barrier metal, the oxidation can easily be observed in a TEM observation image or the like.

The method for manufacturing a semiconductor device according to Embodiment 2 will next be described with reference to the wiring sectional view shown in FIG. 6.

Figure 6A:
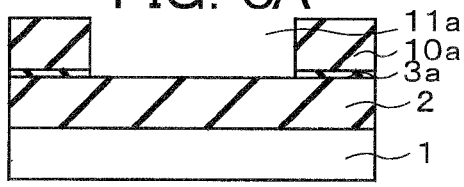
FIG. 6 is a sectional view showing the manufacturing method according to Embodiment 2 of the present invention.

First, as shown in FIG. 6A, the interlayer insulation film 2 composed of $SiO_2$, the etch-stop film 3a composed of SiCN, and the wiring interlayer insulation film 10a composed of $SiO_2$ are layered on the semiconductor substrate 1 in which a semiconductor element (not shown) is formed, and a wiring trench 11a is formed in the wiring interlayer insulation film 10a by a damascene method.

Examples of films that may be used as the etch-stop film 3a are an $SiO_2$ film, an SiN film, an SiC film, an SiCN film, an SiOC film, an SiOCH film, or at least one of a film in which an organic compound is included in the aforementioned films, a film having an organic compound as the primary component, and a film in which SiO is included in a film having an organic compound as the primary component. These films are films provided to enhance the workability of the via hole and the dual-damascene shaped wiring trench, and may be modified according to the intended working material. The use of $SiO_2$ or DVS-BCB (divinylsiloxane-benzocyclobutene) created by plasma polymerization is particularly preferred. Alternatively, the etch-stop film 3a may be omitted when not useful for etching.

Typical examples of the wiring interlayer insulation film 10a may include $SiO_2$, SiC, SiCN, HSQ (hydrogen silsesquioxane) film (e.g., Type 12™), MSQ (methyl silsesquioxane) film (e.g., JSR-LKD™, ALCAP™, NCS™, IPS™, and HOSP™), organic polymer film (SiLK™, Flare™), SiOCH, SiOC (e.g., Black Diamond™, CORAL™, AuroraULK™, Orion™, and the like); or insulation thin films in which an organic compound is included in the abovementioned substances; molecular pore film in which a cyclic organic silica starting material is used; film in which a plurality of any of the abovementioned films is layered; film in which the composition or density of any of the abovementioned films is varied in the film thickness direction; or film in which the via interlayer insulation film of the abovementioned films is irradiated by UV and increased in strength.

An example of the layering structure is a structure in which a two-layer structure composed of $SiO_2$/AuroraULK™ (=upper layer/lower layer) is formed, and the $SiO_2$ is used as a protective film for AuroraULK™ during CuCMP, or a structure in which Black Diamond™/AuroraULK™ (=upper layer/lower layer) is used to reduce capacitance between wiring units.

An example of the layering structure is a structure in which a three-layer structure composed of $SiO_2$/AuroraULK™/$SiO_2$ (=upper layer/middle layer/lower layer) is formed, wherein the upper-layer $SiO_2$ is used as a protective film for the AuroraULK™ during CuCMP, and the lower-layer $SiO_2$ is used as an adhesive layer.

Figure 6B:
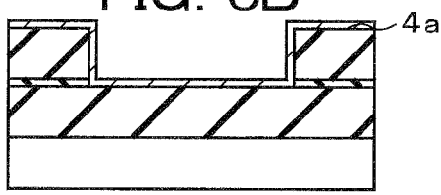

The barrier metal film 4a is then formed on a wiring trench 11a as shown in FIG. 6B. The barrier metal film 4a may be formed using a sputtering method, a CVD method, an ALCVD method, or the like. For example, high-melting metals such as tantalum (Ta), tantalum nitride (TaN), titanium nitride (TiN), and tungsten carbonitride (WCN); nitrides and the like thereof, or layered films thereof are used. A Ta/TaN (=upper layer/lower layer) layered film is particularly preferred for use.

Figure 6C:
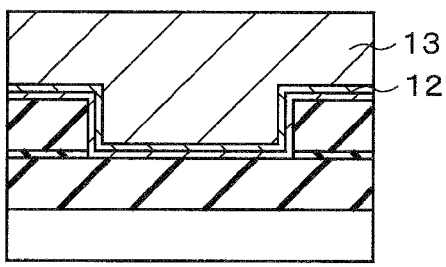
Figure 6D:
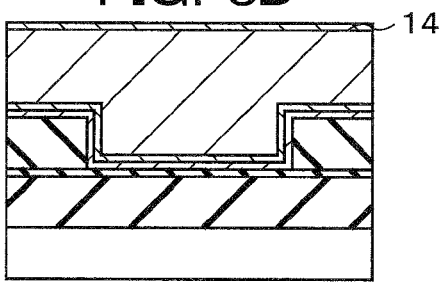
Figure 6E:
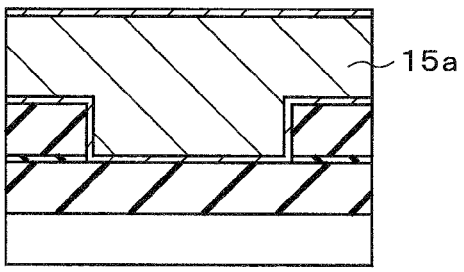

Next, a copper or copper alloy seed film 12 is formed on the barrier metal film 4a as shown in FIG. 6C, and a copper plating film 13 is then filled into the wiring trench 11a by an electroplating method using the copper or copper alloy seed film 12 as the electrode. An oxygen absorption film 14 is then formed on the copper plating film 13 as shown in FIG. 6D. Heat treatment at a temperature in the range of 200 to 400° C. is then applied to the structure shown in FIG. 6D (the barrier metal film 4a, the films 12, 13 primarily composed of copper, and the oxygen absorption film 14), whereby the oxygen absorption film 14 reacts with the oxygen within and on the surface of the copper plating film 13, and a low-oxygen-concentration copper film 15a is formed on the barrier metal film 4a as shown in FIG. 6E.

The copper or copper alloy seed film 12 may be formed by a CVD method or a sputtering method in which a copper or copper alloy target is used. The metal element included in the copper alloy target may be at least one metal selected from aluminum, tin, titanium, tungsten, silver, zirconium, indium, and magnesium. In particular, copper aluminum alloy seed layers may be formed by an ionized sputtering method in which a copper aluminum alloy target is used that includes 0.1 to 4.0 at % of aluminum in a copper target, and copper may be filled in by an electroplating method using the copper aluminum alloy seed layers as electrodes to fabricate the copper or copper alloy seed film 12. In other words, a copper plating film 13 having a copper alloy film 12 as a seed in which a solid solution is formed with an added element for which the absolute value of the standard energy of formation of the oxidation reaction in the range from room temperature to 400° C. is larger than that of the barrier metal film 4a is preferably used as the film 15a primarily composed of copper. In the copper plating film 15a having the copper alloy film 12 as a seed in which the added element forms a solid solution, the absolute value of the standard energy of formation of the oxidation reaction of the added element is preferably larger than that of the barrier metal film 4a and less than or equal to that of the metal that constitutes the oxygen absorption film 14 formed in the aforementioned step. When an alloy seed layer and an electroplating method are combined, the concentration of metal elements other than copper in the alloy wiring is less than or equal to the concentration thereof in the alloy target.

There is also a method for filling in the wiring trench by sputtering or CVD rather than the method for performing electroplating on the copper or copper alloy seed film.

The material used for the oxygen absorption film 14 is a material in which a standard energy of formation of the oxidation reaction in the range from room temperature to 400° C. is negative, and in which the absolute value of the standard energy of formation is larger than that of the barrier metal film 4a formed in the step shown in FIG. 6C.

When an oxygen absorption film in which the standard energy of formation of the oxidation reaction is smaller than that of the barrier metal film is formed on the copper or copper alloy film surface, oxygen in the natural oxide film formed on the copper or copper alloy film surface reacts during the subsequent heating step with the metal that constitutes the oxygen absorption film formed on the surface, and surface oxidation of the barrier metal film due to diffusion of oxygen into the film therefore does not occur. During the heating step, since oxygen components included as impurities in the copper or copper alloy film also react with the metal that constitutes the oxygen absorption film, the oxygen concentration in the copper or copper alloy film can be significantly reduced. A state in which oxides of the barrier metal films 4a, 4b are not present is thereby achieved at the grain boundaries included in the copper or copper alloy wiring 5a as well as in the portions where the surfaces of the barrier metal films 4a, 4b are in contact. The oxygen absorption film that has reacted with the oxygen components is removed in a subsequent CMP step.

When Ta or a structure in which Ta and a nitride film thereof are layered is used as the barrier metal, aluminum, titanium, magnesium, calcium, zirconium, beryllium, hafnium, a silicon film, or the like may be used as the oxygen absorption film. When Ti or a structure in which Ti and a nitride film thereof are layered is used as the barrier metal, aluminum, magnesium, calcium, zirconium, beryllium, a hafnium film, or the like may be used as the oxygen absorption film. The same barrier metal oxidation prevention effects can be obtained by an oxygen absorption film composed of a metal in which the standard energy of formation of the oxidation reaction is negative, and in which the absolute value of the standard energy of formation is larger than that of the barrier metal film, regardless of whether the constituent metal thereof is in a solid solution with respect to the copper or copper alloy film.

Figure 6F:
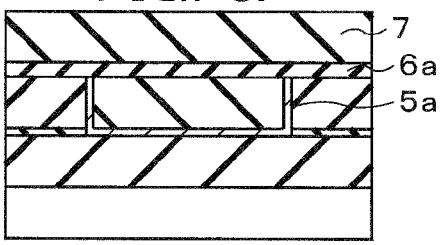

Prescribed quantities of the oxygen absorption film 14 and the low-oxygen-concentration copper film 15a are then removed by CMP (Chemical Mechanical Polishing), the copper or copper alloy wiring 5a is formed, and the wiring protective film 6a and the via interlayer insulation film 7 are formed in sequence on the upper surface, as shown in FIG. 6F.

Examples of films that may be used as the wiring protective film 6a for covering the upper surface of the copper or copper alloy wiring 5a are an SiN film, an SiC film, an SiCN film, an SiOC film, an SiOCH film, or at least one of a film in which an organic compound is included in the aforementioned films, a film having an organic compound as the primary component, and a film in which SiO is included in a film having an organic compound as the primary component. For example, a DVS-BCB (divinylsiloxane-benzocyclobutene) film created by a plasma polymerization method, or a DVS-BCB compound or the like may be used. A BCB compound is a compound formed by mixing BCB with a plurality of gas starting materials to form a film. The specific inductive capacity between the wiring units can be reduced through the use of these BCB films.

Typical examples of the via interlayer insulation film 7 may include $SiO_2$, SiC, SiCN, HSQ (hydrogen silsesquioxane) film (e.g., Type 12™), MSQ (methyl silsesquioxane) film (e.g., JSR-LKD™, ALCAP™, NCS™, IPS™, and HOSP™), organic polymer film (SiLK™, Flare™), SiOCH, SiOC (e.g., Black Diamond™, CORAL™, AuroraULK™, Orion™, and the like); or insulation thin films in which an organic compound is included in the abovementioned substances; molecular pore film in which a cyclic organic silica starting material is used; film in which a plurality of any of the abovementioned films is layered; film in which the composition or density of any of the abovementioned films is varied in the film thickness direction; or film in which the via interlayer insulation film of the abovementioned films is irradiated by UV and increased in strength.

Figure 6G:
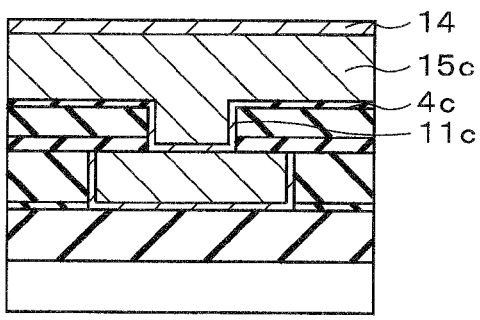
Figure 6H:
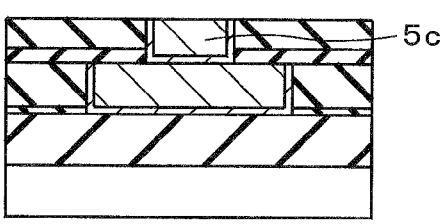

The via hole 11c is then formed, and the barrier metal film 4c and a low-oxygen-concentration copper film 15c are formed therein as shown in FIG. 6G. In the low-oxygen-concentration copper film 15c, heat treatment is applied after the oxygen absorption film is formed on the upper surface, in the same manner as the underlayer wiring. Prescribed quantities of the oxygen absorption film 14 and the low-oxygen-concentration copper film 15c are then removed by CMP (Chemical Mechanical Polishing), and the copper or copper alloy via 5c is formed, as shown in FIG. 6H.

Figure 6I:
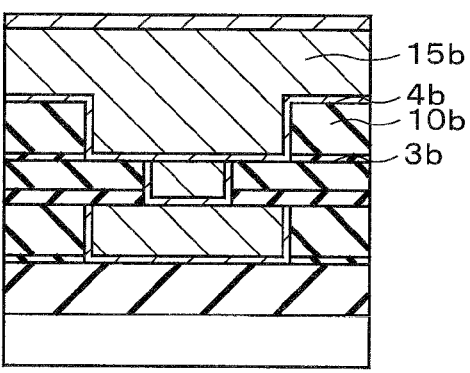
Figure 6J:
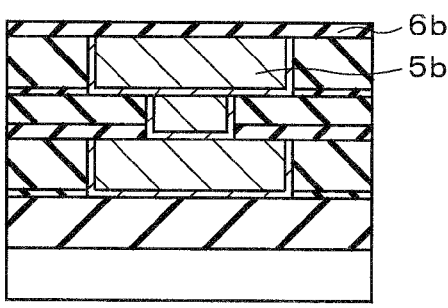

The etch-stop film 3b and the wiring interlayer insulation film 10b are then formed in sequence as shown in FIG. 6I, and the barrier metal film 4b and the low-oxygen-concentration copper film 15b are formed. In the low-oxygen-concentration copper film 15b, heat treatment is applied after the oxygen absorption film is formed on the upper surface, in the same manner as the underlayer wiring.

Typical examples of the wiring interlayer insulation film 10b may include SiO$_2$, SiC, SiCN, HSQ (hydrogen silsesquioxane) film (e.g., Type 12™), MSQ (methyl silsesquioxane) film (e.g., JSR-LKD™, ALCAP™, NCS™, IPS™, and HOSP™), organic polymer film (SiLK™, Flare™), SiOCH, SiOC (e.g., Black Diamond™, CORAL™, AuroraULK™, Orion™, and the like); or insulation thin films in which an organic compound is included in the abovementioned substances; molecular pore film in which a cyclic organic silica starting material is used; film in which a plurality of any of the abovementioned films is layered; film in which the composition or density of any of the abovementioned films is varied in the film thickness direction; or film in which the via interlayer insulation film of the abovementioned films is irradiated by UV and increased in strength.

An example of the layering structure is a structure in which a two-layer structure composed of SiO$_2$/AuroraULK™ (=upper layer/lower layer) is formed, and the SiO$_2$ is used as a protective film for AuroraULK™ during CuCMP, or a structure in which Black Diamond™/AuroraULK™ (=upper layer/lower layer) is used to reduce capacitance between wiring units.

An example of the layering structure is a structure in which a three-layer structure composed of SiO$_2$/AuroraULK™/SiO$_2$/(=upper layer/middle layer/lower layer) is formed, wherein the upper-layer SiO$_2$ is used as a protective film for the AuroraULK™ during CuCMP, and the lower-layer SiO$_2$ is used as an adhesive layer.

Prescribed quantities of the oxygen absorption film and the low-oxygen-concentration copper film 15b are then removed by CMP, and the copper or copper alloy wiring 5b is formed, after which the upper surface is covered by the wiring protective film 6b composed of SiCN.

Use of the wiring structure described above makes it possible to prevent oxidation of the barrier metal in the portions in which the barrier metal films 4a, 4b, 4c are in contact with the grain boundaries in the copper or copper alloy wiring 5a, 5b and the copper or copper alloy via 5c. Since adhesion between the barrier metal films 4a, 4b, 4c and the copper or copper alloy wiring 5a, 5b and copper or copper alloy via 5c is thereby enhanced, electromigration resistance and stress migration resistance can be enhanced. The damascene wiring trench processing method does not limit the present invention.

Example 1

Figure 7:
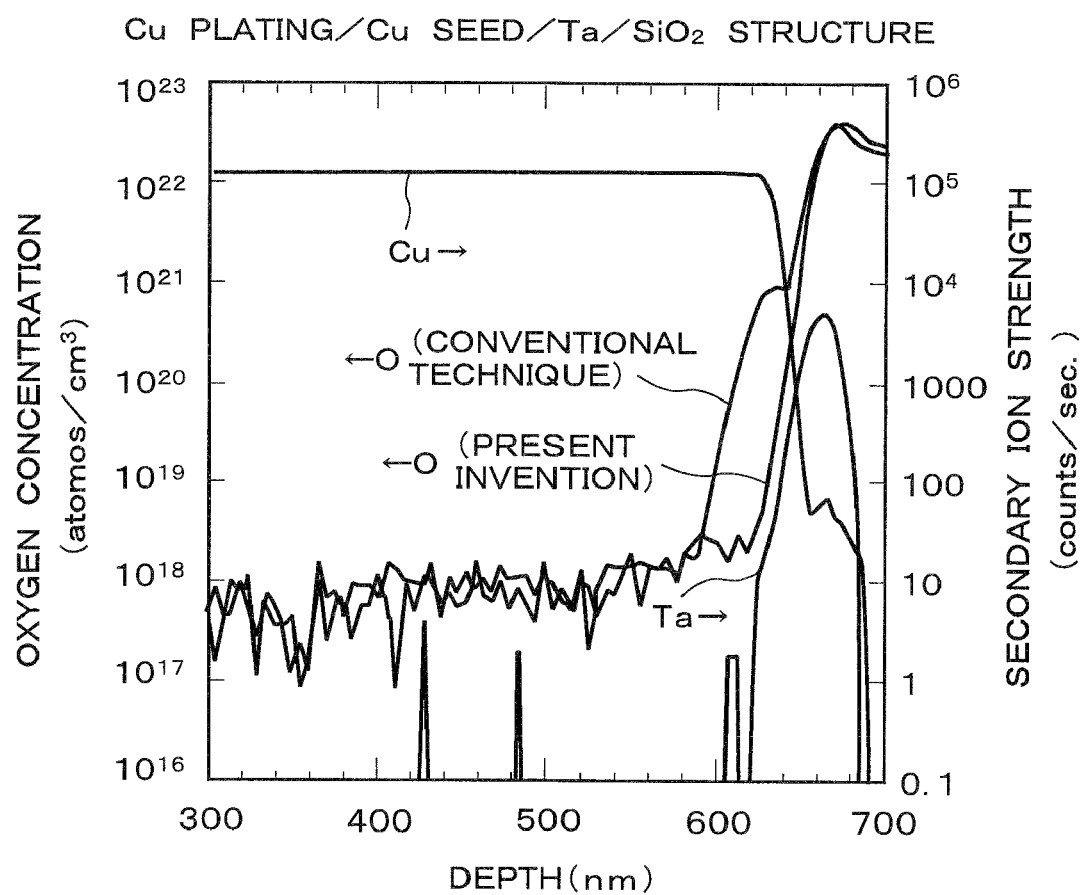
FIG. 7 is a diagram showing the concentration distribution of oxygen, copper, and tantalum in wiring in which the conventional technique and the present invention are applied.

An example of the present invention will be described using FIG. 7. FIG. 7 shows the oxygen concentration profile in the films when the Ta/TaN layered film is formed as the barrier metal film, and the copper seed film, the copper plating film, and the oxygen absorption film composed of an Al thin film having a thickness of 3 nm are formed in sequence on the upper surface, and the assembly is heated at 350° C. in the manufacturing steps shown in FIGS. 4E and 6E. The oxygen concentration profile in the conventional structure in which heat is applied without forming the oxygen absorption film is also shown simultaneously as a comparative example. The lesser depth is towards the Cu plating film. A case is shown in which the barrier metal film is formed on the silicon oxide film formed on the silicon substrate, and the oxygen concentration profile is calculated by SIMS analysis from the side of the back surface of the substrate. Therefore, oxygen is detected inside the barrier metal film, but the oxygen is from the base silicon oxide film, and oxygen is confirmed to be absent inside the barrier metal film.

Figure 8:
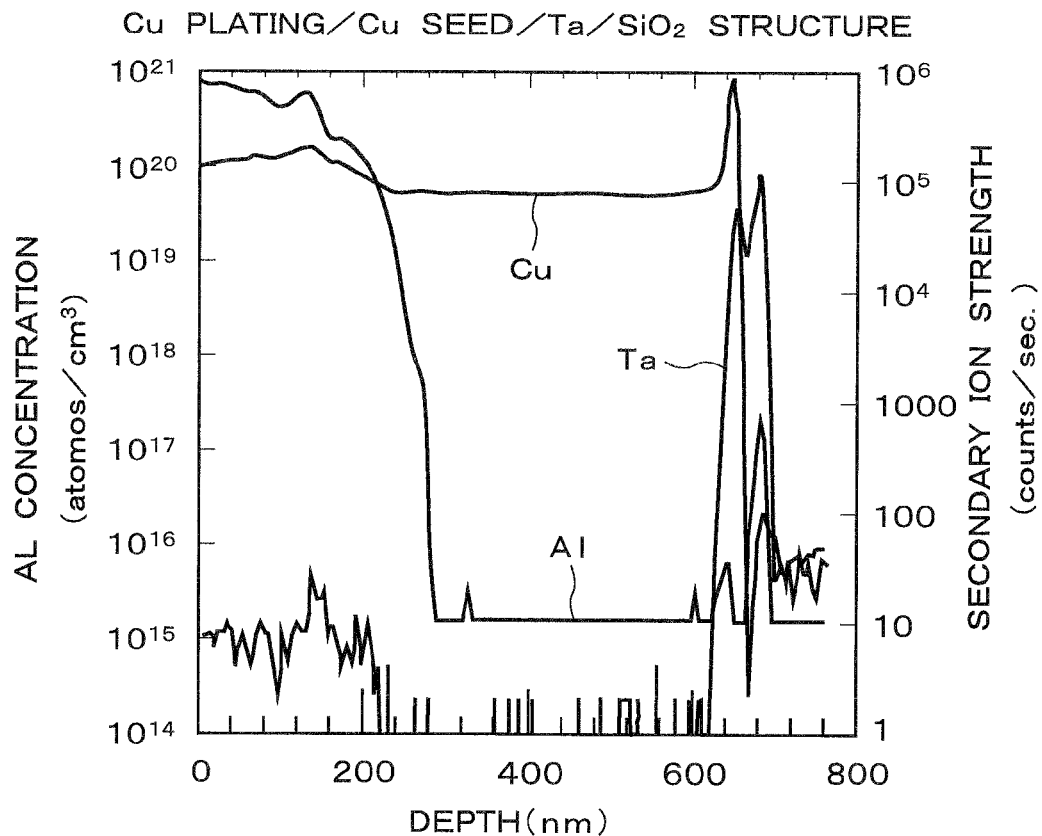
FIG. 8 is a diagram showing the metal concentration distribution including aluminum in wiring in which the conventional technique and the present invention are applied.
Figure 9:
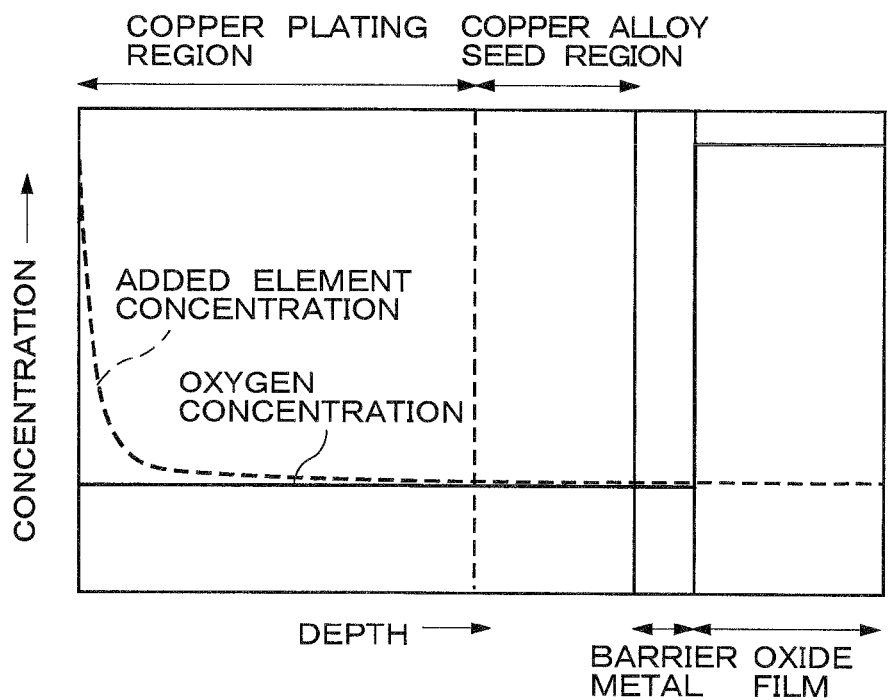
FIG. 9 is a diagram showing the concentration distribution of oxygen and the added element in wiring in which the conventional technique and the present invention are applied.

In the conventionally structured wiring, the oxygen concentration profile has an inflection point in the interface of the Ta film and the Cu, and the oxygen concentration increases in the interface portion. Specifically, oxidation of the Ta film is confirmed. In the structure that uses the oxygen absorption film according to the present invention, an inflection point is not present in the oxygen concentration profile in the interface of Cu and the Ta film, and the change is monotonic. Specifically, it was confirmed that the Ta film was not oxidized. At the inflection point of the oxygen concentration profile of the interface of Cu and the Ta film in the conventional structure, the oxygen concentration increased to a value of $10^{20}$ atoms/cm$^3$ or higher. FIG. 8 shows the results of analyzing the aluminum concentration profile in the copper film in the structure by SIMS analysis from the back surface in the same manner as in FIG. 7. The lesser depth is towards the Cu plating film. There was no diffusion into the copper film in the vicinity of the barrier metal film (in the range of 300 nm from the barrier film) even from heating at 350° C. in the oxygen absorption film composed of aluminum having a thickness of 3 nm that was formed on the upper surface of the copper film, and aluminum was not included in the copper portion remaining as wiring that was not removed by CMP performed in the subsequent step. Therefore, in the present example, there was no observed increase in wiring resistance in comparison to the conventional structure. FIG. 9 is a schematic view of the profiles of oxygen and the added element when the effects of oxygen on the back surface of the substrate are excluded from the SIMS profiles shown in FIGS. 7 and 8. When the aluminum thickness is high, since more Al is present than the amount necessary for bonding with oxygen, Al diffuses into the copper film, and the wiring resistance increases. Since voids also occur particularly in minute vias in the copper film due to the Kirkendall effect, it is important that the thickness of Al be 10 nm or less (100 Å (Angstrom) or less), as in the present example.

Use of the wiring structure according to the manufacturing method described above enabled electromigration resistance and stress migration resistance to be enhanced without increasing the wiring resistance.

Example 2

Figure 10:
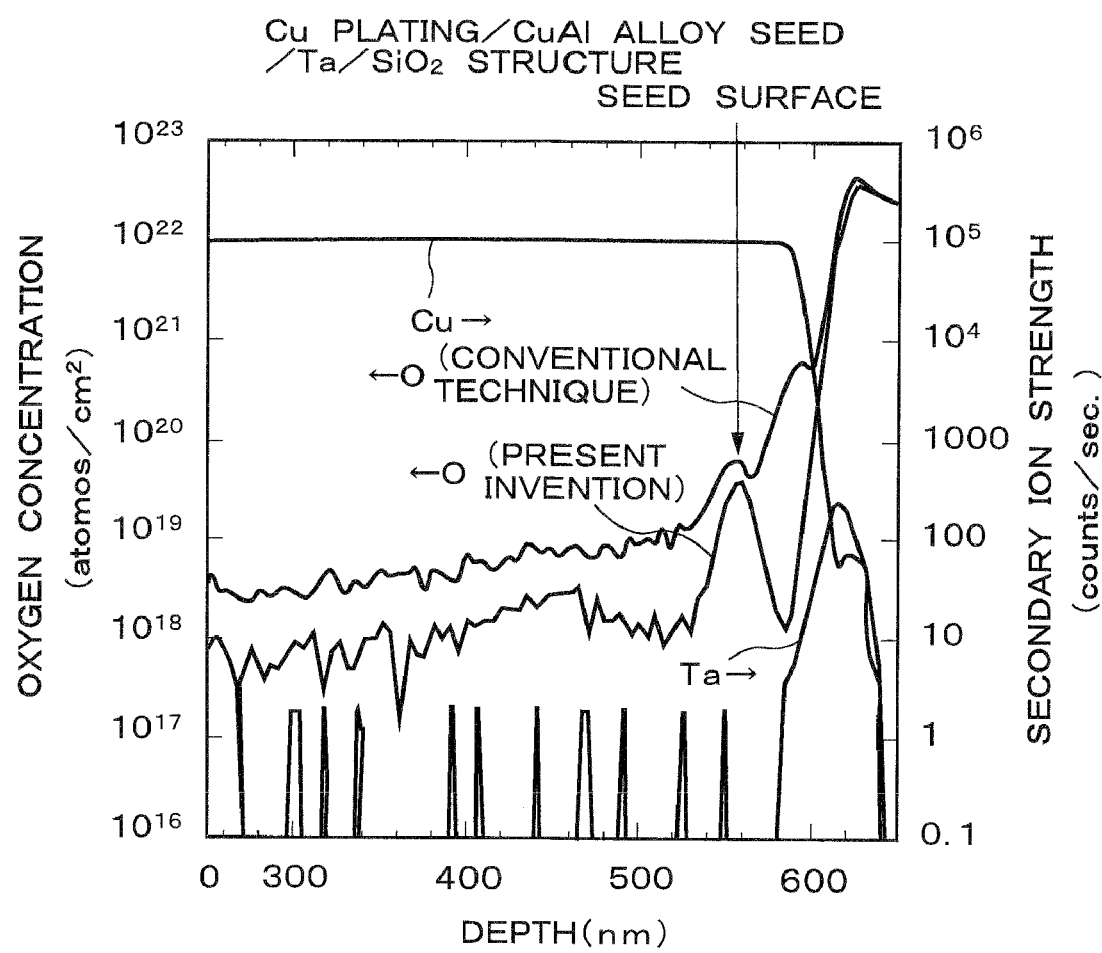
FIG. 10 is a diagram showing the concentration distribution of oxygen, copper, and tantalum in wiring in which the conventional technique and the present invention are applied.
Figure 11:
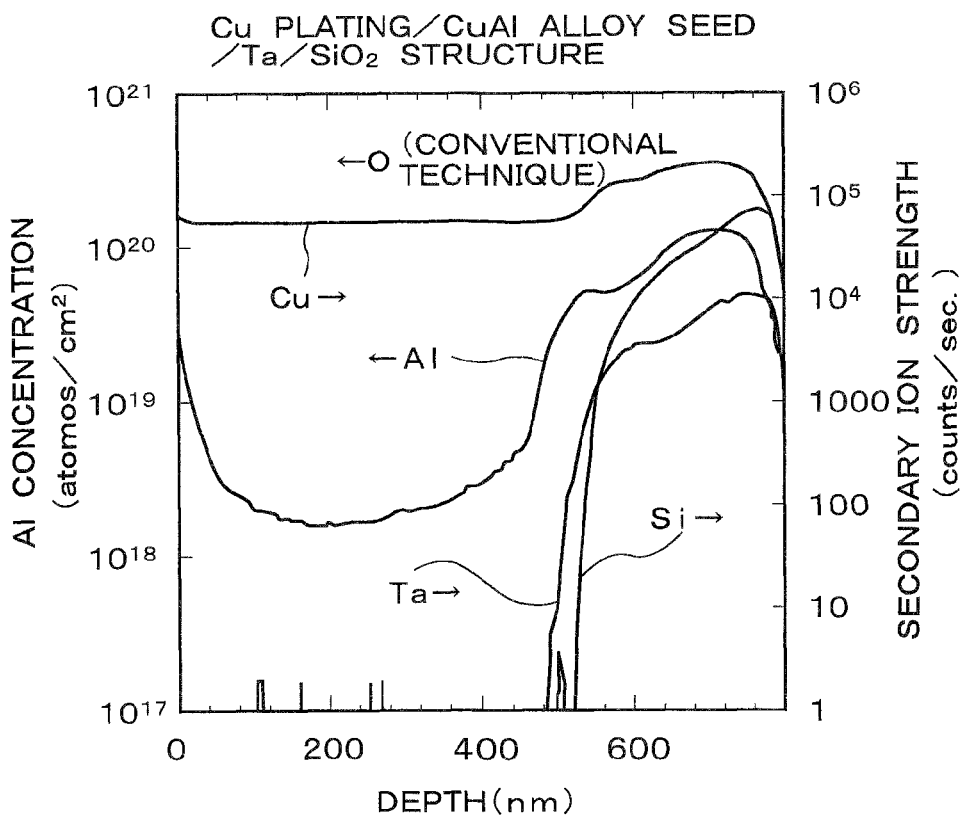
FIG. 11 is a diagram showing the metal concentration distribution including aluminum in wiring in which the conventional technique and the present invention are applied.
Figure 12:
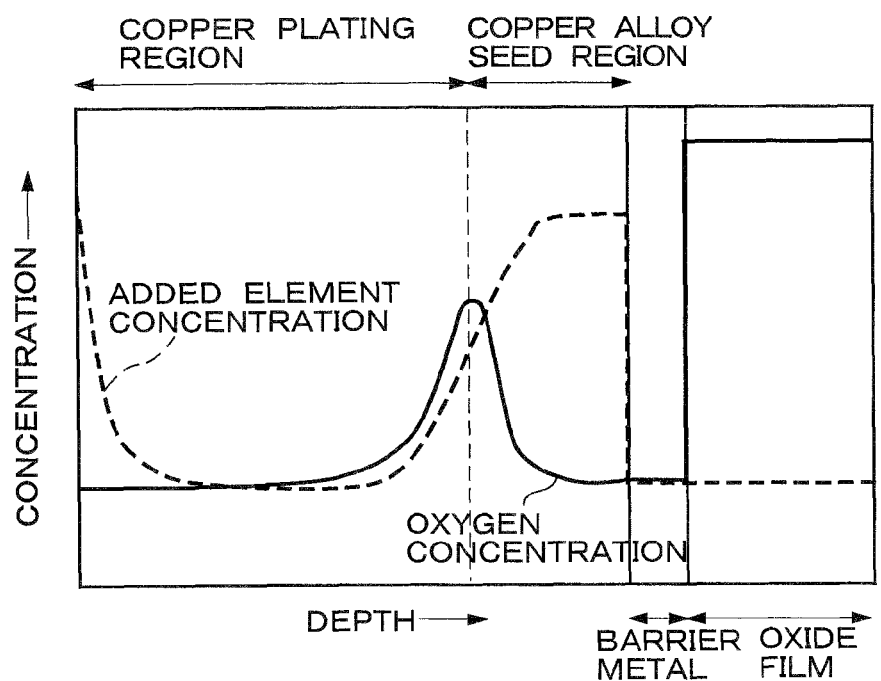
FIG. 12 is a schematic diagram showing the concentration distribution of oxygen and the added element in wiring in which the conventional technique and the present invention are applied.

An example of the present invention will be described using FIG. 10. FIG. 10 shows the oxygen concentration profile in the films when the Ta/TaN layered film is formed as the barrier metal film, and the copper aluminum alloy seed film, the copper plating film, and the oxygen absorption film composed of an Al thin film are formed in sequence on the upper surface, and the assembly is heated at 350° C. in the manufacturing steps shown in FIGS. 4E and 6E. The oxygen concentration profile in the conventional structure in which heat is applied without forming the oxygen absorption film is also shown simultaneously as a comparative example. The lesser depth is towards the Cu plating film. A case is shown in which the barrier metal film is formed on the silicon oxide film formed on the silicon substrate, and the oxygen concentration profile is calculated by SIMS analysis from the side of the back surface of the substrate. Therefore, oxygen is detected inside the barrier metal film, but the oxygen is from the base silicon oxide film, and oxygen is confirmed to be absent inside the barrier metal film. FIG. 11 shows the results of measuring the aluminum concentration profile by SIMS analysis from the surface side in the copper film in the same structure as in FIG. 10. The lesser depth is towards the Cu plating film. FIG. 12 is a schematic view of the profiles of oxygen and the added element when the effects of oxygen on the back surface of the substrate are excluded from the SIMS profiles shown in FIGS. 10 and 11.

Figure 13:
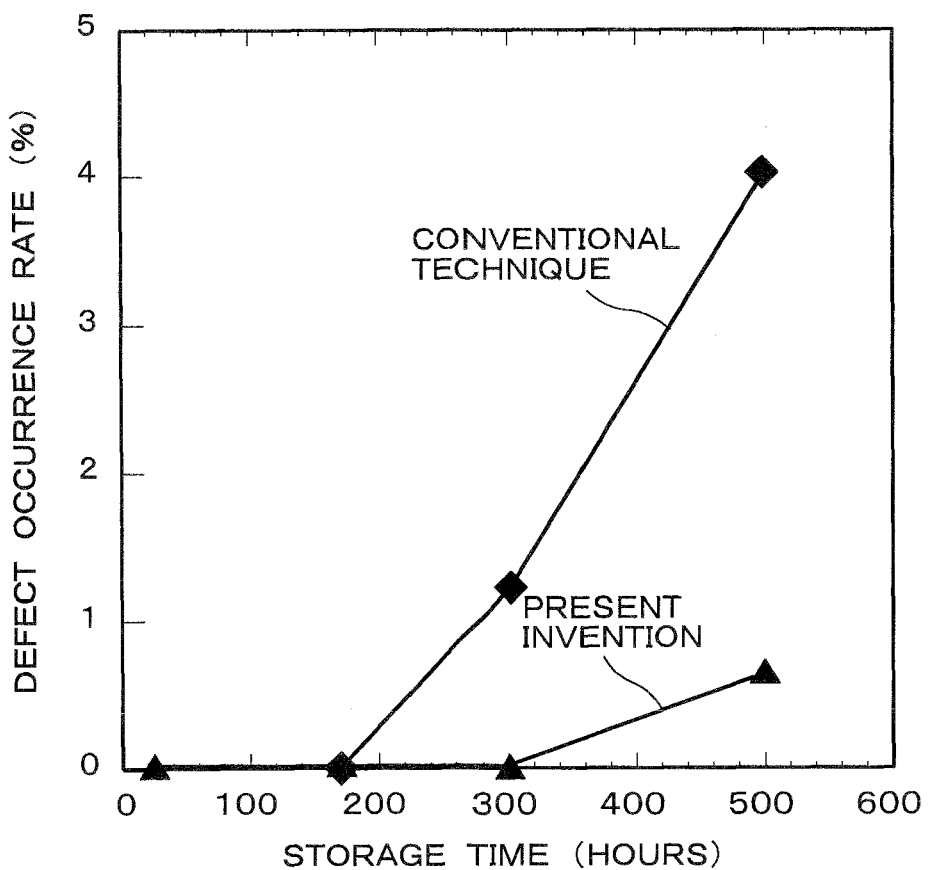
FIG. 13 is a diagram showing the rate of defect occurrence of a via chain pattern in isothermal storage testing (150° C.) of wiring in which the conventional technique and the present invention are applied.

In the conventionally structured wiring, an inflection point is present in the oxygen concentration profile in the interface of Cu and the Ta film, and the oxygen concentration increases in the interface portion, as is apparent from FIG. 10. Specifically, oxidation of the Ta film is confirmed. In the structure that uses the oxygen absorption film according to the present invention, an inflection point is not present in the oxygen concentration profile in the interface of Cu and the Ta film, and the change is monotonic. Specifically, it was confirmed that the Ta film was not oxidized. Also, since a copper aluminum alloy film was used as the seed in the present example, oxygen was trapped by the seed film surface in the conventional structure and the structure of the present invention, but the oxygen concentration in the copper alloy film in the conventional structure was higher than the oxygen concentration in the copper film in the conventional structure when the copper film shown in FIG. 7 was used. The reason for this is that the oxygen in the copper film was difficult to reduce even when heat treatment was applied in the copper alloy film, due to bonding of oxygen atoms with the metal added element. A region in which the oxygen concentration in the copper plating film was $4 \times 10^{18}$ atoms/cm$^3$ or higher was present in the conventionally structured wiring, but in the structure that uses the oxygen absorption film according to the present invention, the oxygen concentration was clearly reduced to $4 \times 10^{18}$ atoms/cm$^3$ or less, and it was apparent that the oxygen in the copper aluminum alloy film can also be absorbed by the oxygen absorption film composed of aluminum. In the structure of the present invention, since the copper aluminum alloy film was used as the seed as is apparent from FIG. 11, the aluminum concentration was high in certain regions of the seed film near the barrier, and the aluminum concentration was low in the copper plating film. As is determined from FIGS. 10 and 11, and FIG. 12 showing the concentration profiles of oxygen or the added element as derived from FIGS. 10 and 11, the change in the added element concentration in the copper has an oxygen peak at the interface of the copper plating film region and the copper alloy seed film region. In the present example, the aluminum concentration in the copper aluminum seed film region is on the order of $10^{19}$ atoms/cm$^3$, and the aluminum concentration in the copper plating film region is on the order of $10^{18}$ atoms/cm$^3$. This concentration is set so as not to increase the resistance of the copper wiring more than necessary, and to a value whereby the oxygen concentration in the copper alloy film does not increase more than necessary due to bonding of oxygen and the metal added element in the copper alloy film. FIG. 13 shows the storage time dependency of the defect occurrence rate of a 100 nm (diameter) via chain pattern (upper-layer wiring and lower-layer wiring width: 3.0 μm) in stress migration testing (storage at 150° C.) performed using wiring in the conventional structure and the structure of the present invention. Chips in which the resistance increased by 5% or more from the initial resistance were determined to be defective. As the results show, the wiring structure of the present example having such characteristics as those described above had a lower rate of defect occurrence due to stress migration than the conventional structure.

A necessary condition for the combination of the type of atoms of the oxygen absorption film and the added element diffused into the copper film from the alloy seed film was that the standard energy of formation of the oxidation reaction in the range from room temperature to 400° C. of the atoms constituting the oxygen absorption film be negative, and that the absolute value of the standard energy of formation be larger than that of the atoms constituting the barrier metal. However, the absolute value of the standard energy of formation is preferably larger than or the same as that of the added element. For example, when the added element is Al, as in Example 2 described above, Al, Mg, Ca, Zr, Be, Hf, or the like is preferred as the oxygen absorption film. When the added element is Sn or Mn, the oxygen absorption film is preferably Al, Ti, Mg, Ca, Zr, Be, Hf, or the like.

Example 3

Figure 14:
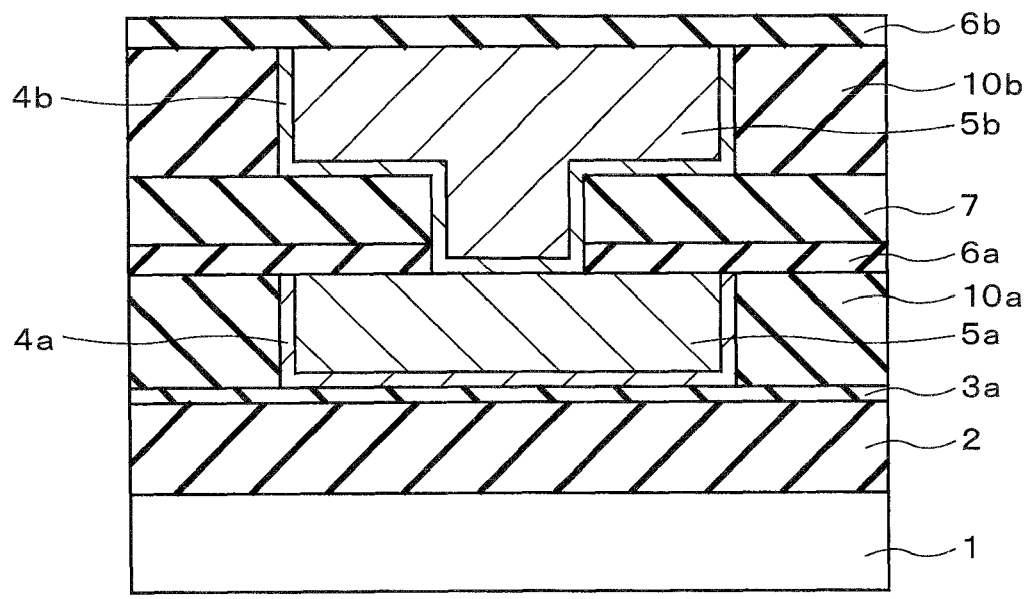
FIG. 14 is a sectional view showing the semiconductor device in which the present invention is applied.

An example of a semiconductor device in which the present invention is implemented will be described using the wiring sectional view shown in FIG. 14. A semiconductor device having the structure shown in FIG. 14 was obtained by processing without the use of the etch-stop film 3b in the step for processing the via hole 11c and the wiring trench lib by the dual damascene method described using FIG. 4H in the semiconductor device described in Embodiment 1.

Through the use of the wiring structure described above, the electromigration resistance and the stress migration resistance were enhanced, the effective inductance of the wiring was reduced, and parasitic capacitance between wiring units was reduced.

Example 4

Figure 4J:
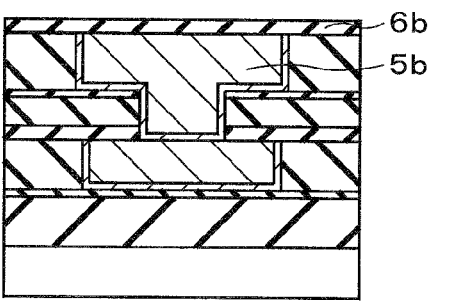

In a semiconductor device having the cross section shown in FIG. 4J described in Embodiment 1, DVS-BCB (divinylsiloxane-benzocyclobutene) films fabricated by plasma polymerization were used as wiring protective films 6a, 6b, whereby electromigration resistance and stress migration resistance were enhanced, the effective inductance of the wiring was reduced, and parasitic capacitance between wiring units was reduced.

A DVS-BCB film includes large quantities of organic components as a wiring protective film, and has poor adhesion to copper or copper alloy relative to a film primarily composed of Si. Therefore, siliciding the surface of the copper or copper alloy is sometimes used to enhance adhesion when a DVS-BCB film is formed on the wiring. The inventors learned through investigation that when silicon that has diffused into the inside from the surface of the copper or copper alloy wiring diffuses to the surface of the barrier metal film at this time, an oxide of the silicon is formed in the barrier metal surface in the conventional technique, which significantly compromises the reliability of the wiring. The reliability of the wiring was therefore enhanced by applying the present invention to a DVS-BCB film in which a siliciding treatment was used.

Example 5

Figure 15:
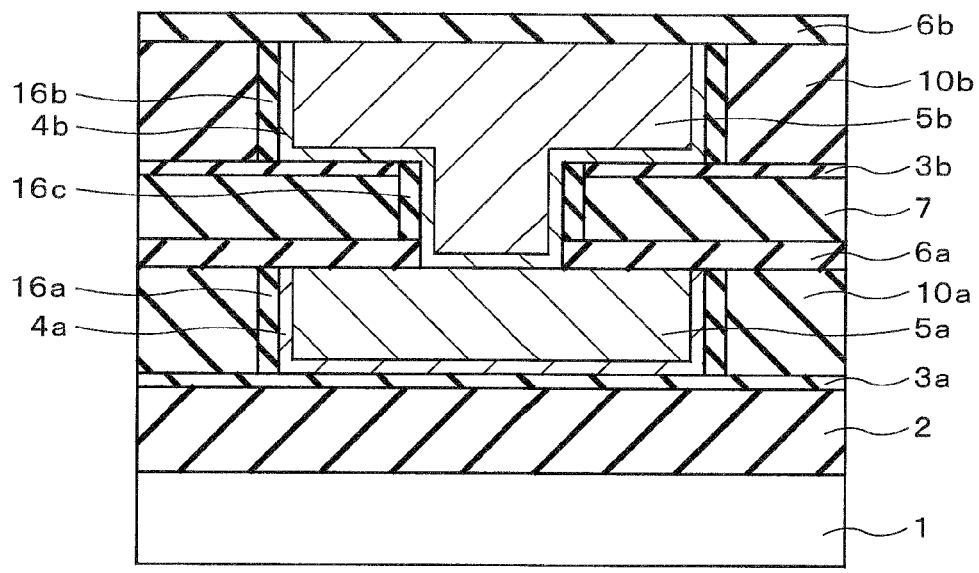
FIG. 15 is a sectional view showing the semiconductor device in which the present invention is applied.

An example of a semiconductor device in which the present invention is implemented will be described using the wiring sectional view shown in FIG. 15. A semiconductor device having the structure shown in FIG. 15 was obtained by forming DVS-BCB (divinylsiloxane-benzocyclobutene) films fabricated by plasma polymerization as side-wall protective films 16a, 16c, 16b for protecting the side walls in the step for processing the wiring trench 11a, the via hole 11c, and the wiring trench 11b by the dual damascene method described using FIGS. 4A and 4H in the semiconductor device described in Embodiment 1.

Through the use of the wiring structure described above, the electromigration resistance and the stress migration resistance were enhanced, and leakage between wiring units was reduced by the effects of protecting the side walls of the interlayer insulation film. Significant effects were obtained particularly when a porous film such as AuroraULK™ was used as at least a portion of the wiring interlayer films 10a, 10b and the via interlayer film 7.

Example 6

An example of a semiconductor device in which the present invention is implemented will be described using the wiring sectional view shown in FIG. 16. A semiconductor device having the structure shown in FIG. 16 was obtained by using the porous film AuroraULK™ and the SiO₂ layered structure of the wiring-layer hard mask (the wiring-layer hard mask is indicated by 17a and 17b in FIG. 16) as the wiring interlayer insulation films 10a, 10b, and using Black Diamond™ or AuroraULK™ in the via interlayer insulation film 7 of the wiring structure shown in FIG. 4J described in Embodiment 1 or Example 4.

The electromigration resistance and stress migration resistance were enhanced through the use of the wiring structure described above, and through the use of AuroraULK™ and Black Diamond™ having lower specific inductance than SiO₂, the effective inductance of the wiring was reduced, and parasitic capacitance between wiring units was reduced.

Example 7

Figure 16:
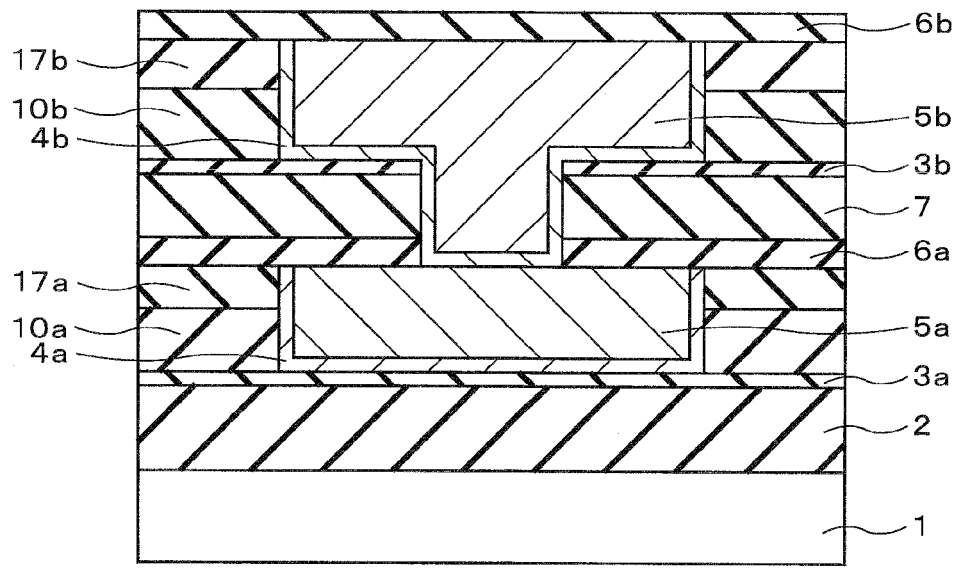
FIG. 16 is a sectional view showing the semiconductor device in which the present invention is applied.

A Black Diamond™ film was used as the wiring-layer hard masks 17a and 17b, and AuroraULK™ was used as the via interlayer insulation film 7 shown in FIG. 16 described in Example 6, whereby the electromigration resistance and stress migration resistance were enhanced, the effective inductance of the wiring was reduced, and parasitic capacitance between wiring units was reduced.

Example 8

Figure 17:
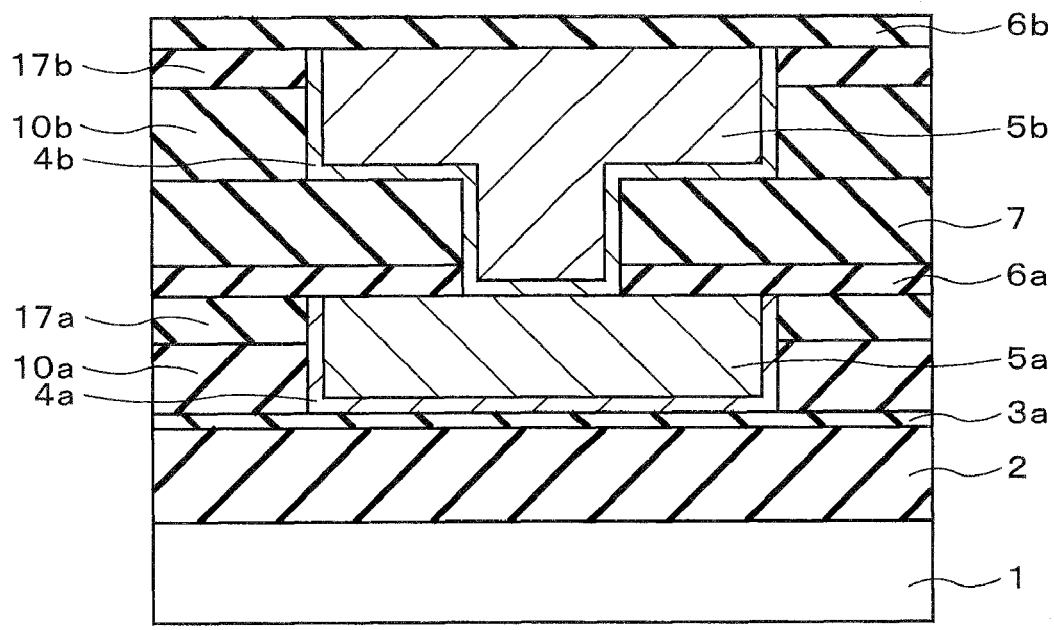
FIG. 17 is a sectional view showing the semiconductor device in which the present invention is applied.

An example of a semiconductor device in which the present invention is implemented will be described using the wiring sectional view shown in FIG. 17. A semiconductor device having the structure shown in FIG. 17 was obtained by using the porous film AuroraULK™ and the SiO₂ layered structure of the wiring-layer hard mask (the wiring-layer hard mask is indicated by 17a and 17b in FIG. 17) as the wiring interlayer insulation films 4a, 4b, and using AuroraULK™ also in the via interlayer insulation film 7 of the wiring structure shown in FIG. 4J described in Example 3.

Through the use of the wiring structure described above, the electromigration resistance and the stress migration resistance were enhanced, the effective inductance of the wiring was reduced, and parasitic capacitance between wiring units was reduced.

Example 9

Figure 18:
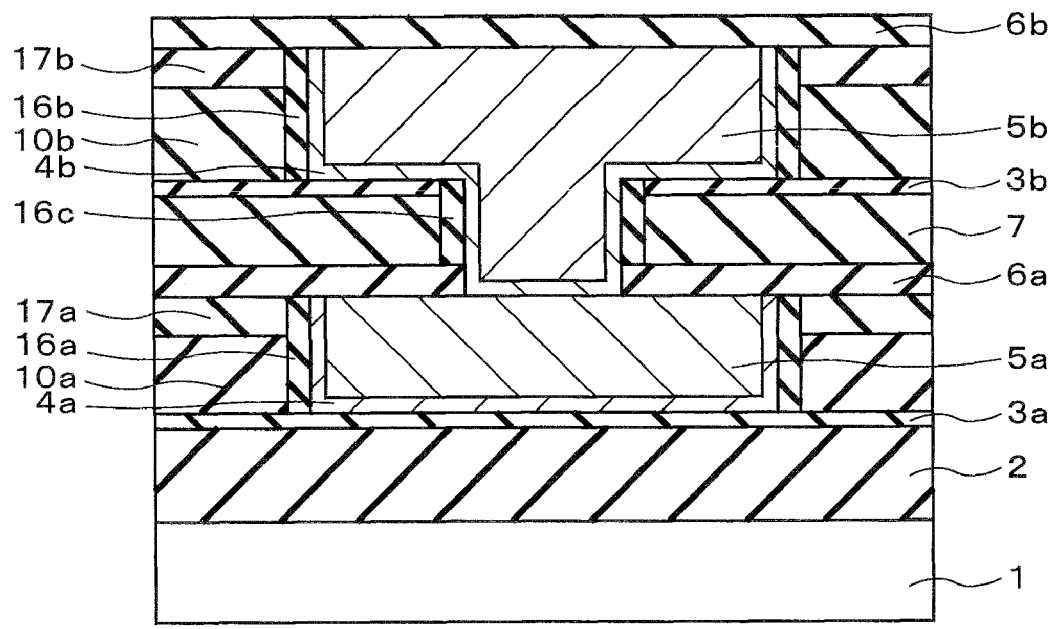
FIG. 18 is a sectional view showing the semiconductor device in which the present invention is applied.

An example of a semiconductor device in which the present invention is implemented will be described using the wiring sectional view shown in FIG. 18. A semiconductor device having the structure shown in FIG. 18 was obtained by forming DVS-BCB (divinylsiloxane-benzocyclobutene) films fabricated by plasma polymerization as side-wall protective films 16a, 16c, 16b for the side walls of the wiring and the via in the wiring structure of FIG. 16 described in Example 6.

Through the use of the wiring structure described above, the electromigration resistance and the resistance to stress-induced voiding were enhanced, and leakage between wiring units was reduced by the effects of protecting the side walls of the interlayer insulation film, and the interface of the wiring interlayer insulation film and the hard mask.

Example 10

Figure 19:
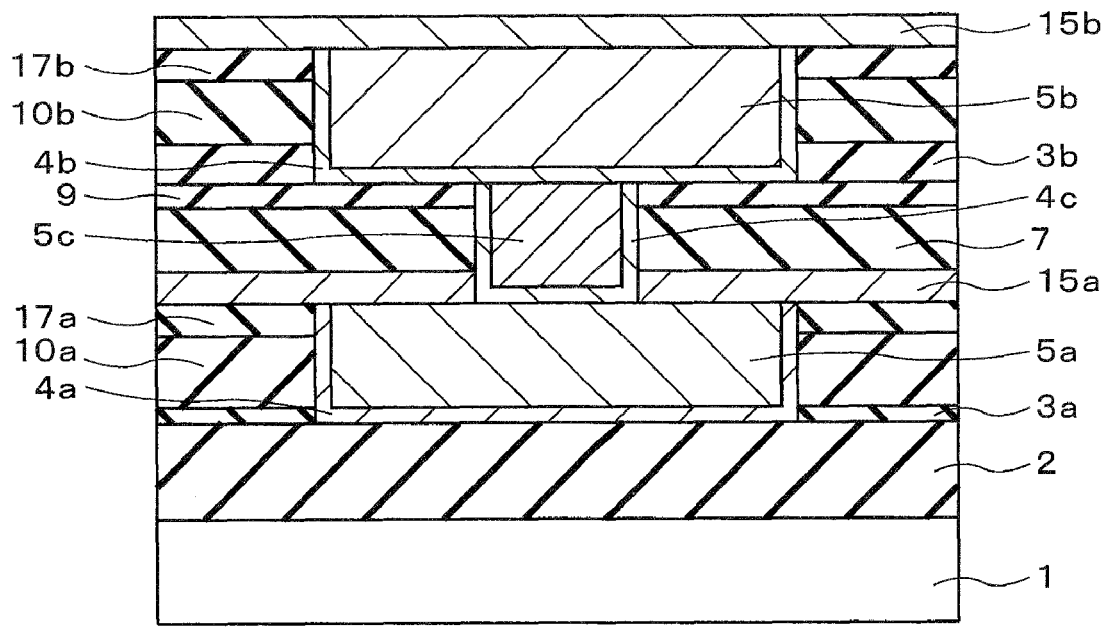
FIG. 19 is a sectional view showing the semiconductor device in which the present invention is applied.

An example of a semiconductor device in which the present invention is implemented will be described using the wiring sectional view shown in FIG. 19. A semiconductor device having the structure shown in FIG. 19 was obtained by using the porous film AuroraULK™ and the SiO₂ layered structure of the wiring-layer hard mask (the wiring-layer hard mask is indicated by 17a and 17b in FIG. 19) as the wiring interlayer insulation films 10a, 10b, and using Black Diamond™ in the via interlayer insulation film 7 of the wiring structure shown in FIG. 6J described in Embodiment 2.

The electromigration resistance and stress migration resistance were enhanced through the use of the wiring structure described above, and through the use of AuroraULK™ and Black Diamond™ having lower specific inductance than SiO₂, the effective inductance of the wiring was reduced, and parasitic capacitance between wiring units was reduced.

Example 11

Figure 20:
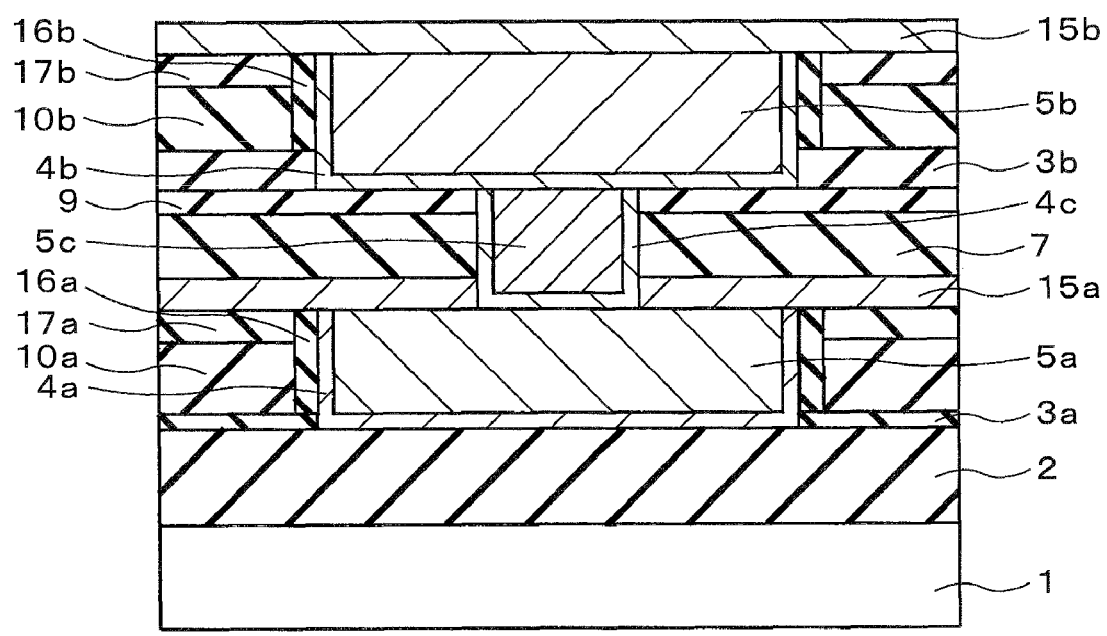
FIG. 20 is a sectional view showing the semiconductor device in which the present invention is applied.

An example of a semiconductor device in which the present invention is implemented will be described using the wiring sectional view shown in FIG. 20. A semiconductor device having the structure shown in FIG. 20 was obtained by forming DVS-BCB (divinylsiloxane-benzocyclobutene) films fabricated by plasma polymerization as side-wall protective films 16a, 16b for the side walls of the wiring in the wiring structure of FIG. 19 described in Example 10.

Through the use of the wiring structure described above, the electromigration resistance and stress migration resistance were enhanced, and leakage between wiring units was reduced by the effects of protecting the side walls of the interlayer insulation film, and the interface of the wiring interlayer insulation film and the hard mask.

INDUSTRIAL APPLICABILITY

The present invention is universally applicable, and the scope of applicability of the present invention is unlimited insofar as the application relates to the wiring structure of multilayer wiring composed of a wiring structure in which a copper alloy primarily composed of copper is used as the wiring material, and to a method for manufacturing the wiring structure.

The present invention was described in relation to several preferred embodiments and examples, but the embodiments and examples were given merely as examples for describing the present invention, and do not limit the present invention.

For example, the present invention was described in detail in relation to a technique for manufacturing a semiconductor device having CMOS circuits in the background field of the invention developed by the inventors, but the present invention is not thus limited. For example, the present invention can also be applied to semiconductor products having memory circuits such as DRAM (Dynamic Random Access Memory), SRAM (Static Random Access Memory), flash memory, FRAM (Ferro Electric Random Access Memory), MRAM (Magnetic Random Access Memory), resistance random access memory, and the like; microprocessors and other semiconductor products having logical circuits; and mixed semiconductor products that employ the abovementioned types of circuits simultaneously. The present invention can also be applied to semiconductor devices, electronic circuit devices, optical circuit devices, quantum circuit devices, micro-machines, and the like that have embedded alloy wiring structures in at least a portion thereof.

The present invention may include various modifications in a technical range based on the claims of the present application, and the technical range of the present invention is in no way limited by the embodiments and examples of the present invention.

The invention claimed is:

1. A method for manufacturing a semiconductor device, characterized in comprising:
    (a) a step for forming a trench and/or a via for forming wiring, in a prescribed region in an insulation film formed on top of a semiconductor substrate;
    (b) a step for forming a barrier metal film on said insulation film in which said trench and/or via is formed;
    (c) a step for forming a copper or copper alloy film on said barrier metal film;
    (d) a step for forming on said copper or copper alloy film an oxygen absorption film in which a standard energy of formation of an oxidation reaction in a range from room temperature to 400° C. is negative, and in which an absolute value of the standard energy of formation is larger than that of the barrier metal film formed in said (b) step;
    (e) a step for heating a layered film composed of said barrier metal film, said copper or copper alloy film, and said oxygen absorption film in a temperature range of 200 to 400° C.; and
    (f) a step for removing an upper part of said layered film and forming wiring.

2. The method for manufacturing a semiconductor device according to claim 1, characterized in that the copper or copper alloy film formed in said (c) step is a copper plating film having a copper alloy film as a seed in which a solid solution is formed with an added element for which the absolute value of the standard energy of formation of the oxidation reaction in the range from room temperature to 400° C. is larger than that of said barrier metal film.

3. The method for manufacturing a semiconductor device according to claim 2, characterized in that
    the copper or copper alloy film formed in said (c) step is a copper plating film having said copper alloy film as a seed in which a solid solution is formed with said added element; and
    the absolute value of the standard energy of formation of the oxidation reaction of said added element is larger than that of said barrier metal film, and is equal to or less than that of the metal that constitutes the oxygen absorption film formed in said (d) step.

4. The method for manufacturing a semiconductor device according to claim 1, characterized in that a thickness of said oxygen absorption film formed in said (d) step is 100 Å or less.

5. The method for manufacturing a semiconductor device according to claim 1, characterized in that
    said barrier metal film is tantalum, tantalum nitride, or a layered film thereof; and
    said oxygen absorption film is formed by a film having aluminum, titanium, magnesium, calcium, zirconium, beryllium, hafnium, or silicon as a primary component.

* * * * *